(12) United States Patent
Nugent, Jr. et al.

(10) Patent No.: US 10,580,921 B2
(45) Date of Patent: Mar. 3, 2020

(54) POWER-OVER-FIBER SAFETY SYSTEM

(71) Applicant: LASERMOTIVE, INC., Kent, WA (US)

(72) Inventors: Thomas J. Nugent, Jr., Bellevue, WA (US); Thomas W. Bashford, Seattle, WA (US); David Bashford, Kent, WA (US); Alexander Hay, Bellevue, WA (US)

(73) Assignee: LASERMOTIVE, INC., Kent, WA (US)

( * ) Notice: Subject to any disclaimer, the term of this patent is extended or adjusted under 35 U.S.C. 154(b) by 0 days.

(21) Appl. No.: 16/033,120

(22) Filed: Jul. 11, 2018

(65) Prior Publication Data
US 2019/0019912 A1    Jan. 17, 2019

Related U.S. Application Data

(60) Provisional application No. 62/531,822, filed on Jul. 12, 2017.

(51) Int. Cl.
| | | |
|---|---|---|
| *H01L 31/054* | (2014.01) | |
| *H04B 10/80* | (2013.01) | |
| *H01L 31/052* | (2014.01) | |

(52) U.S. Cl.
CPC ........ *H01L 31/0547* (2014.12); *H01L 31/052* (2013.01); *H04B 10/807* (2013.01)

(58) Field of Classification Search
CPC .. H01L 31/0547; H01L 31/052; H04B 10/807
See application file for complete search history.

(56) References Cited

U.S. PATENT DOCUMENTS

| | | | |
|---|---|---|---|
| 4,040,867 A | 8/1977 | Forestieri et al. | |
| 7,813,646 B2 * | 10/2010 | Furey | H04B 10/807 398/135 |
| 9,090,315 B1 * | 7/2015 | Stone | G02B 6/3604 |
| 9,800,091 B2 | 10/2017 | Nugent, Jr. et al. | |
| 9,838,143 B2 | 12/2017 | Chan et al. | |
| 9,912,379 B2 | 3/2018 | Hyde et al. | |

(Continued)

OTHER PUBLICATIONS

U.S. Appl. No. 16/033,082, filed Jul. 11, 2018, Power-Over-Fiber Receiver.

*Primary Examiner* — Jayne L Mershon
(74) *Attorney, Agent, or Firm* — Seed IP Law Group LLP

(57) ABSTRACT

An electromagnetic energy transmitting device includes a processing unit, a light-detecting sensor coupled to the processing unit, and a high-flux electromagnetic energy transmitter. An electromagnetic energy receiver arranged to convert received light into electricity. A first fiber-based conduit couples the high-flux electromagnetic energy transmitter to the electromagnetic energy receiver. The first fiber-based conduit is arranged to pass high-flux light from the high-flux electromagnetic energy transmitter to the electromagnetic energy receiver. A second fiber-based conduit couples the electromagnetic energy receiver to the light-detecting sensor. The second fiber-based conduit is arranged to pass at least some light from the electromagnetic energy receiver to the light-detecting sensor, wherein the processing unit is arranged to control an output of the high-flux light from the high-flux source based on a control signal from the light-detecting sensor.

20 Claims, 10 Drawing Sheets

(56) References Cited

U.S. PATENT DOCUMENTS

| | | |
|---|---|---|
| 2014/0318620 A1 | 10/2014 | Kare et al. |
| 2015/0380588 A1 | 12/2015 | Lasich |
| 2017/0151755 A1 | 6/2017 | Koba |
| 2019/0020304 A1 | 1/2019 | Bashford et al. |

* cited by examiner

POWER-OVER-FIBER SAFETY SYSTEM

BACKGROUND

Technical Field

The present disclosure generally relates to an optical fiber-based safety system integrated into a power-over-fiber system. More particularly, but not exclusively, the present disclosure relates to a power-over-fiber (PoF) system having a high-flux electromagnetic energy transmitter coupled via a fiber-based conduit and a fiber-based safety system to an electromagnetic energy receiver that converts received light into electricity.

Description of the Related Art

Some aspects of technologies and related art that may be useful in understanding the present invention are described in U.S. patent application Ser. No. 14/124,993, which is now U.S. Pat. No. 9,800,091 issued to Nugent et al. The Nugent patent describes an aerial platform that receives power in the form of light (e.g., laser light) transmitted via an optical fiber from a remote optical power source. The platform comprises a receiver, which converts at least a portion of the received light to a different form of power, for example electric power. In the Nugent publication, the platform comprising the receiver also comprises a propulsion element, which consumes the different form of power to generate propulsive thrust. Supplying power to the aerial platform from a remote source enables the platform to remain aloft longer than a battery or fuel tank carried by the platform would allow. Transmitting the power in the form of light is preferable in many cases to transmitting electric power, because electrical conductors are generally heavier than optical fibers, and are hazardous in the presence of lightning or a high-voltage power line. The Nugent patent is incorporated herein by reference.

Another patent application that may be useful to help understand the present invention is U.S. patent application Ser. No. 14/263,858, which is also U.S. Patent Publication No. 2014/0318620 A1 to Kare et al. The Kare application describes a device for converting electromagnetic radiation into electricity along with other related systems and methods. In the application, electromagnetic radiation is converted into electricity via an expander (e.g., an optical "spike") that includes a conical shape. The expander has an axis and a curved surface that is configured to reflect electromagnetic radiation away from the axis. The beam of electromagnetic radiation is expanded, and one or more energy conversion components receives the expanded electromagnetic radiation and generate electricity. With the expander's curved surface, a beam of electromagnetic radiation that has a large radiation flux is converted into a beam that has a larger cross-sectional area.

Some other aspects of technologies and related art that may be useful in understanding the present invention are described in U.S. patent application Ser. No. 11/776,527, which is now U.S. Pat. No. 7,813,646 B2 to Furey, and which describes a power over optical fiber system.

In the Furey patent document, a system provides power to remote equipment. In the system, a transmit unit having lasers transmits laser light over optical fiber to a receive unit having photovoltaic receivers. The photovoltaic receivers convert the laser light to electrical energy for the remote equipment. The receive unit also sends a feedback signal to the transmit unit, which the transmit unit uses to determine whether the lasers should be enabled for full power. The feedback signal sent by Furey's receive unit may be an electronic signal sent over a wire or a generated light-based signal sent over an optical fiber.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which in and of itself may also be inventive.

BRIEF SUMMARY

Certain power-over-fiber (PoF) systems are not as safe as they could be. In PoF systems, a high-flux light source, such as a laser, is coupled to an energy conversion receiver, such as a photovoltaic (PV) cell assembly, by a fiber-based conduit. The light source, conduit, and receiver are individually and collectively enclosed such that objects and entities (e.g., people, animals, and the like) are not exposed to high-flux energy in normal and safe operating conditions.

In many cases, the light source is separated from the receiver by a significant distance, and one or more obstacles are fixedly or transiently located between the light source and the receiver. The objects may include people, animals, vehicles, vessels, or other objects. If the fiber-based conduit is severed, damaged, or disconnected while the light source is transmitting high-flux energy such as a laser beam, then people or animals may be exposed to, and injured by, the high-flux energy. Embodiments of an improved safety system for PoF systems is disclosed herein.

In a first embodiment, an electromagnetic energy transmitting device includes a processing unit, a light-detecting sensor coupled to the processing unit, and a high-flux electromagnetic energy transmitter. An electromagnetic energy receiver is arranged to convert received light into electricity. A first fiber-based conduit couples the high-flux electromagnetic energy transmitter to the electromagnetic energy receiver. The first fiber-based conduit is arranged to pass high-flux light from the high-flux electromagnetic energy transmitter to the electromagnetic energy receiver. A second fiber-based conduit couples the electromagnetic energy receiver to the light-detecting sensor. The second fiber-based conduit is arranged to pass at least some light from the electromagnetic energy receiver to the light-detecting sensor, wherein the processing unit is arranged to control an output of the high-flux light from the high-flux source based on a control signal from the light-detecting sensor.

A power over fiber safety system may be summarized as including a processing unit; a light-detecting sensor coupled to the processing unit; a high-flux electromagnetic energy transmitter; an electromagnetic energy receiver arranged to convert received light into electricity; a first fiber-based conduit optically coupling the high-flux electromagnetic energy transmitter to the electromagnetic energy receiver, the first fiber-based conduit arranged to pass high-flux light from the high-flux electromagnetic energy transmitter to the electromagnetic energy receiver; and a second fiber-based conduit optically coupling the electromagnetic energy receiver to the light-detecting sensor, the second fiber-based conduit arranged to pass at least some light from the electromagnetic energy receiver to the light-detecting sensor, wherein the processing unit is arranged to control an output of the high-flux light from the high-flux electromagnetic energy transmitter based on a control signal from the light-detecting sensor. The processing unit and the light-detecting sensor may be integrated into the high-flux electromagnetic energy transmitter. The control signal from the light-detecting sensor may be asserted when light passed via the second fiber-based conduit drops below a determined threshold.

The electromagnetic energy receiver may further include a first optical element arranged to convert a first portion of the high-flux light to electricity; and a second optical element arranged to direct a second portion of the high-flux light toward the light-detecting sensor via the second fiber-based conduit.

The second optical element may further include a prism.

The second optical element may further include a reflecting device. The first fiber-based conduit and the second fiber-based conduit may be separate and distinct, and the first fiber-based conduit and the second fiber-based conduit may be substantially bundled by a common containment structure. The first fiber-based conduit and the second fiber-based conduit may be a same fiber-based conduit.

A power over fiber safety system may further include an electromechanical shade responsive to the control signal, the electromechanical shade arranged to allow or prevent the high-flux light from passing out of the high-flux electromagnetic energy transmitter.

The second optical element may further include a housing, the housing having a first opto-mechanical coupling arranged to accept the first fiber-based conduit and a second opto-mechanical coupling arranged to accept the second fiber-based conduit.

A power over fiber safety method may be summarized as including generating, with a high-flux electromagnetic energy transmitter, a high-flux light; transmitting the high-flux light toward an electromagnetic energy receiver via a first fiber-based conduit; providing a safety sensor, the safety sensor arranged to receive a secondary light signal from the electromagnetic energy receiver via a second fiber-based conduit; and generating with the safety sensor, an indication that the transmission of the high-flux light should cease.

A power over fiber safety method may further include, based on the indication that the transmission of the high-flux light should cease, controlling an electromechanical shade to prevent the high-flux light from passing out of the high-flux electromagnetic energy transmitter. The high-flux light and the secondary light signal may have the same wavelength. The high-flux light and the secondary light signal may have a different wavelength.

A power over fiber safety method may further include receiving a control signal to override the safety sensor.

A safety-system enabled electromagnetic energy receiver may be summarized as including a housing; at least one opto-mechanical coupling arranged in a portion of the housing to receive a fiber-based conduit; an energy conversion component arranged to receive high-flux light and generate electricity from at least a first portion of the received high-flux light; and an optical element arranged to direct a second portion of the received high-flux light out from the housing as an indication that the high-flux light was received.

A safety-system enabled electromagnetic energy receiver may further include at least one second opto-mechanical coupling arranged in a second portion of the housing to receive a second fiber-based conduit, wherein the fiber-based conduit is arranged to receive the first and second portions of the high-flux light, and wherein the second fiber-based conduit is arranged to pass the second portion of the received high-flux light out from the housing. The opto-mechanical coupling and the second opto-mechanical coupling may be threaded couplings. The high-flux light may be a laser light. The optical element may be arranged to reflect, refract, or focus the second portion of the received high-flux light.

This Brief Summary has been provided to introduce certain concepts in a simplified form that are further described in detail below in the Detailed Description. Except where otherwise expressly stated, the Brief Summary does not identify key or essential features of the claimed subject matter, nor is it intended to limit the scope of the claimed subject matter.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. One or more embodiments are described hereinafter with reference to the accompanying drawings in which.

DETAILED DESCRIPTION

Figure 1:
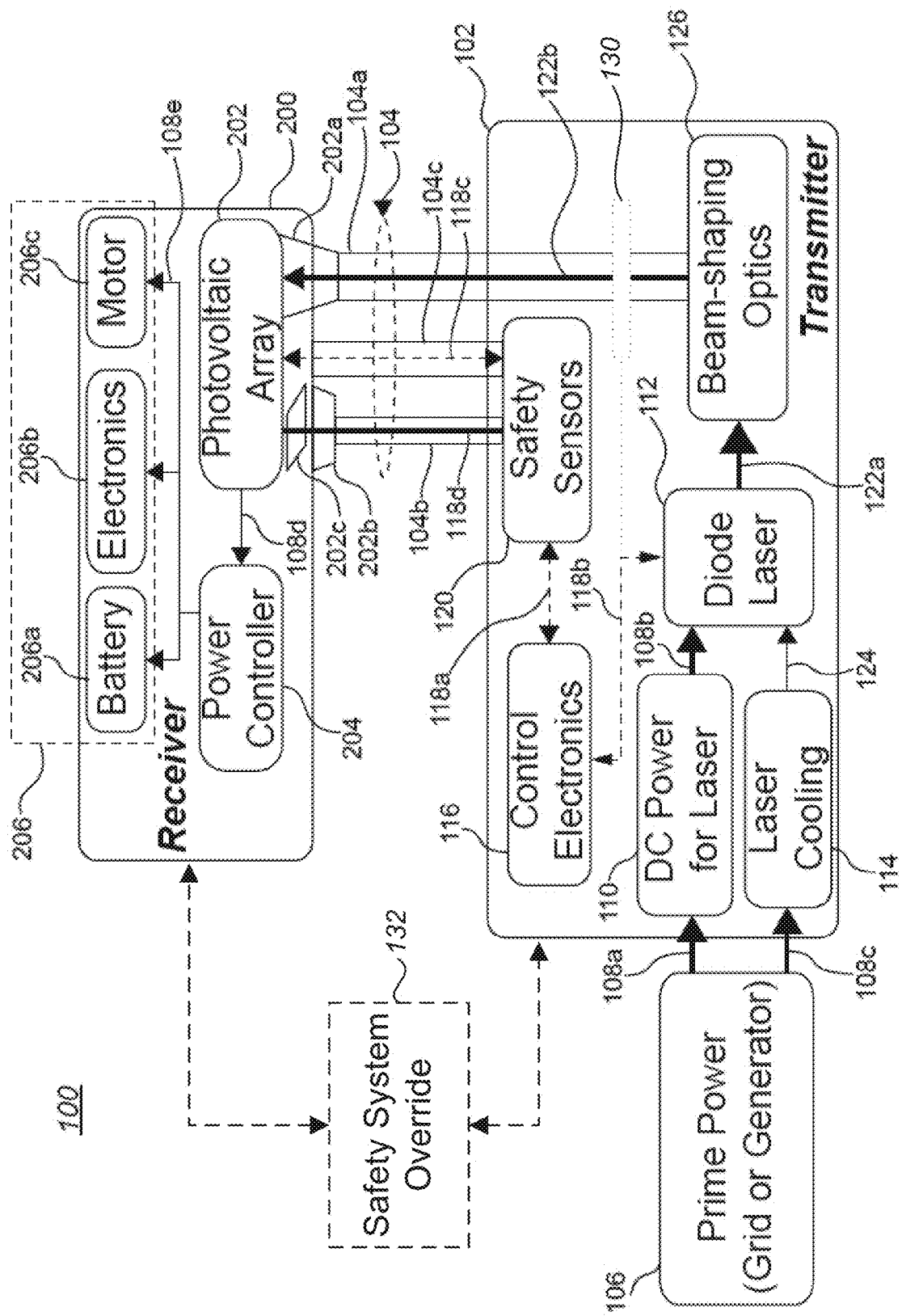
FIG. 1 is a schematic diagram of one embodiment of a power-over-fiber (PoF) system.

Power-over-fiber (PoF) systems generally include a high-flux electromagnetic energy transmitter (e.g., a laser light source) and an electromagnetic energy receiver coupled together by a fiber-based conduit (e.g., a fiber optic cable). Light from the high-flux electromagnetic energy transmitter passes through the fiber-based conduit to the electromagnetic energy receiver, and the electromagnetic energy receiver converts the received light into electricity. In many cases, a laser-based system in the electromagnetic energy transmitter generates the high-flux light, and a photovoltaic array in the electromagnetic energy receiver converts the received light into electricity.

It has been recognized by the inventor that in particular circumstances of PoF systems, improvements in safety may be achieved when a portion of the high-flux light passed from the high-flux electromagnetic energy transmitter is used to control certain operations of the high-flux electromagnetic energy transmitter. For example, in addition to the first fiber-based conduit that passes "primary light" from the high-flux electromagnetic energy transmitter to the electromagnetic energy receiver, a second fiber-based conduit (e.g., a second fiber-optic cable) can also be used to pass a portion of the high-flux light (i.e., "secondary light") to an electromagnetic radiation-based sensor (e.g., a photodiode, an infrared sensor, or the like). The amount of secondary light returned by the electromagnetic energy receiver can be any desirable amount. In at least one embodiment, however, the portion of the high-flux light returned to the high-flux electromagnetic energy transmitter as secondary light is less than one percent (1%) of the high-flux light.

The electromagnetic radiation-based sensor is often proximate to, or integrated in, the high-flux electromagnetic energy transmitter. The secondary light passed through the second fiber-based conduit can be used as a control signal. In this way, if the secondary light is not detected at a time when the high-flux source is transmitting primary light, then the absence of secondary light represents an indication that the first fiber-based conduit is broken, damaged, or no longer directing light into the electromagnetic energy receiver for some other reason. Because this condition can create a diminishment or absence of safety to life or property, it is desirable in at least some cases to stop or at least suspend the transmission of primary light. It is further desirable to stop or suspend the transmission of primary light in a predictable way, which can be as-soon-as-technically-possible, as soon as detected, in real time, or on some other schedule or measurement of time.

In some other cases, however, it may be desirable to override the PoF safety system described herein. For example, during installation, testing, configuration, reconfiguration, or in other cases, it may be desirable to continue the transmission of primary light even when a sufficient amount of secondary light is not being returned to the electromagnetic radiation-based sensor. Accordingly, a means for overriding the PoF safety system may include any one or more optical, mechanical, and electronic structures to effect the override.

An electronic circuit may take input, for example, that then prevents the automatic disabling of the high-flux electromagnetic energy transmitter, that spoofs a valid return of light from the electromagnetic energy receiver, or overrides the PoF safety system in some other electronic way. As another example, an optical or mechanical override may direct or re-direct secondary light right from the high-flux electromagnetic energy transmitter to the electromagnetic radiation-based sensor via an alternate path. In still one more example, an electronic secondary light source may optically or mechanically act as an overriding light source. In this way, the PoF safety system may be further tested, and this means may also provide advantageous testing because the testing can also be performed without use of the high-flux electromagnetic energy transmitter.

In some embodiments, the secondary light produced in the electromagnetic energy receiver is directed into, or otherwise toward, the second fiber-based conduit using an optical element such as a prism. When the secondary light signal is lost or sufficiently diminished, as determined by the electromagnetic radiation-based sensor, the transmission of high-flux energy can cease (e.g., the high-flux electromagnetic energy transmitter can be shut off or otherwise attenuated, an aperture permitting the transmission of high-flux energy can be closed or otherwise blocked, or the like). Shutting off, or otherwise diminishing/preventing, the high-flux electromagnetic energy transmission based on this control signal improves safety by reducing or eliminating the chance that a broken or disconnected fiber-based conduit is allowing the high-flux (i.e., primary) light to be directed into an unknown space instead of being directed into the enclosed electromagnetic energy receiver. Another benefit of this arrangement is that transmission of the light-based control signal is not reliant on any powered electronics or otherwise active elements in the electromagnetic energy receiver, which permits a generally simpler and potentially more reliable safety system.

FIG. 1 is a schematic diagram of one embodiment of a power-over-fiber (PoF) system 100. In the PoF system 100, an electromagnetic energy transmitter 102 produces and passes high-flux electromagnetic energy to an electromagnetic energy receiver 200 via one or more signal conduits 104. The signal conduits 104 may be arranged to pass information as light, electricity, or mechanical data. For example, in some cases, the signal conduits 104 include fiber-based conduit that is arranged as a light conductive structure, a light carrying medium, or some other light transfer means. In some cases, the signal conduits 104 include electrically-conductive-based conduit such as copper that is arranged to pass electrical signals having any suitable voltage, current, frequency, phase, or the like. In these or still other case, the signal conduits 104 include mechanical-based conduit such as hose that is arranged to pass mechanical information such as air pressure signals, hydraulic pressure signals, or the like.

The electromagnetic energy transmitter 102 may receive power from an external or internal power source 106. The external or internal power source 106 may draw, generate, or otherwise supply power to the electromagnetic energy transmitter 102 from a central power authority grid, a generator, or some other system.

Within the PoF system 100, electricity 108 having a variety of properties is passed. The variety of properties may include any one or more of voltage, current, frequency, phase, persistence, transience, magnetic characteristics, and the like. Generally in FIG. 1, electricity signals 108 are illustratively sized in accordance to their relative electric potential, but such illustration is non-limiting. Instead, the different relative sizes are provided as but one example to a practitioner of ordinary skill. In FIG. 1, electricity 108*a* represents electricity from an external or internal power source 106 to an electromagnetic energy transmitter 102, electricity 108b represents electricity from an internal power supply 110 to a laser source 112, electricity 108c represents electricity from an external or internal power source 106 to a laser cooling module 114, electricity 108d represents electricity from an energy conversion component 202 to a power control module 204, and electricity 108e represents electricity from a power control module 204 to one or more electricity consuming devices 206.

The energy conversion component 202 in the present disclosure is simplified so as to not obscure other features that are described more prominently and in substantial detail. The energy conversion component 202 may include any number of additional sub-components, which are not shown. In some cases, the energy conversion sub-components of the energy conversion component 202 include one or more photovoltaic (PV) cells. In some cases, the energy conversion sub-components include optical structures (e.g., lenses, prisms, mirrors, and the like). In some cases, the energy conversion sub-components include electronic circuitry to accumulate charge, switch current, shape signals, and the like. Other sub-components of the energy conversion component 202 are also considered.

In the embodiment of FIG. 1, the laser source 112 is a diode laser source. Other laser source devices are contemplated. For example, the laser source 112 may be a fiber laser doped with any suitable element, a gas-based laser, a solid state-based laser or any other type of laser. In addition, or in the alternative, the laser source 112 may be a device that produces a different type of high-flux electromagnetic energy.

In FIG. 1, the electricity consuming devices 206 optionally include a battery 206a, an electronic circuit 206b, and a motor 206c. In these or other embodiments, the electricity consuming devices 206 may of course include any other types of electricity consuming devices including, but not limited to, light producing devices, computing devices, communication devices, telecommunication devices, mechanical devices, electromechanical devices, airborne devices, waterborne devices, stationary devices, mobile devices, industrial devices, consumer devices, and a wide range of other devices that operate using electricity or otherwise benefit from the use electricity.

An electronics control module 116 associated with the electromagnetic transmitter 102 directs operations of the electromagnetic transmitter 102 via a plurality of control and data signals 118. Control and data signals 118a represents control and data signals passed between the electronics control module 116 and a safety sensors module 120. Control and data signals 118b represents control and data signals between the electronics control module 116, an optional electro-mechanical shade 130, and the diode laser source 112. Control and data signals 118c represent control and data signals between the safety sensors module 120 and the electromagnetic energy receiver 200. And a secondary light signal 118d represents a safety control signal passed from the electromagnetic energy receiver 200 to the electromagnetic transmitter 102.

In some embodiments, secondary light signal 118d may be a portion of primary light energy 122b passed back from the electromagnetic energy receiver 200 toward the electromagnetic transmitter 102 as a secondary light signal. In these cases, the safety sensors module 120 may include a light-based detection device (e.g., a photodiode) that determines whether or not the primary light energy 122b is reaching the electromagnetic energy receiver 200. In these or alternative embodiments, some or all of the safety sensors module 120 is structurally integrated in the electromagnetic energy transmitter 102. In other embodiments, some or all of the safety sensors module 120 is separate and distinct from the electromagnetic energy transmitter 102.

In other embodiments, the secondary light signal 118d is generated from a separate receiver-based light source such as a light emitting diode. In such a case, the separate receiver-based light source (i.e., secondary light source) may be powered by an electronics circuit of the power control module 204, a battery, or some other source. In this way, the secondary light source can be illuminated when the high-flux electromagnetic energy transmitter 102 is providing the primary light source and extinguished if the primary light is not reaching the electromagnetic energy receiver 200. Alternatively, to facilitate an override system, for example, the secondary light signal 118d may be desirably provided whether or not the primary light is reaching the electromagnetic energy receiver 200. In still other cases, when the secondary light signal 118d is generated from a separate receiver-based light source, the secondary light may have a different frequency, phase, modulation, or some other characteristic. In at least one case, the secondary light is encoded (e.g., modulated, pulsed, or the like) with information that is communicated from the electromagnetic energy receiver 200 to the high-flux electromagnetic energy transmitter 102.

In one embodiment, at the command and direction of the electronics control module 116, the diode laser source 112 produces collimated laser light 122a having any desired properties (e.g., wavelength (i.e., monochromaticity), divergence, coherence, flux, etc.). The diode laser source 112 may be cooled by the laser cooling module 114 that deploys any particular cooling technology and its associated cooling medium 124. In some cases, the cooling technology is a water-based cooling technology, and the cooling medium 124 is water.

The collimated laser light 122a is received and acted on by a beam-shaping optics module 126. The beam-shaping optics module 126 forms the electromagnetic energy of the electromagnetic energy transmitter 102 into a laser light having any selected properties 122b. The laser light 122b is passed through a first (primary) fiber-based conduit 104a to the electromagnetic energy receiver 200. Optionally, a second (secondary) fiber-based conduit 104b is arranged to pass some portion of the laser light 122a back from the electromagnetic energy receiver 200 toward the safety sensors module 120 associated with the electromagnetic energy transmitter 102. The portion of the laser light 122a passed via the fiber-based conduit 104b may be referred to as a secondary light signal 118d, a safety signal, or some other suitable term. And in some cases, the PoF system 100 may include a third optional (secondary) communications conduit 104c. Control and data signals 118c are passed between the safety sensors module 120 and the electromagnetic energy receiver 200 via the optional third (secondary) communications conduit 104c.

In some cases, an optional electro-mechanical shade 130 is integrated within or arranged in proximity to the front of the electromagnetic energy transmitter 102. The electro-mechanical shade 130, when used, can quickly prevent high-flux light energy 122b from being transmitted via the primary fiber-based conduit 104a. In some cases, the electro-mechanical shade is biased to prevent high-flux light energy 122b from being transmitted. In this way, the bias must be affirmatively overcome in order to transmit the high-flux light energy 122b via the primary fiber-based conduit 104a. For example, the electro-mechanical shade 130 may be forced closed by gravity, a spring, or some other biasing mechanism. At desirable times, such as during normal operation, a control or data signal 118b is used to direct a latch, drive, or some other system to overcome the bias.

An optional safety system override 132 may be arranged as part of the electromagnetic energy transmitter 102, as part of the electromagnetic energy receiver 200, as a standalone control device, or in some other configuration. In some cases, for example, some functions of the optional safety system override 132 may be distributed amongst the transmitter, receiver, or other parts of such a system. Communications, between the optional safety system override 132 and other parts of the PoF system 100 may be unidirectional or bi-directional.

The signal conduits 104 may have the same or different properties. Two or more signal conduits 104 may be separate and distinct, and two or more other signal conduits 104 may share one or more physical structures. The signal conduits 104 may include one or more fiber-optic cables or fiber-optic cable strands. The signal conduits 104 may be bundled or otherwise arranged in a single containment structure (e.g., a jacket, sheath, insulator, pipe, or the like). Alternatively, signal conduits 104 may be bundled or otherwise arranged in separate containment structures. The signal conduits 104 may include any one or more other conduits (e.g., cables, wires, sheaths, or the like) to provide mechanical strength, stability, bias, or other properties. The signal conduits 104 may include one or more sensors that consume or provide one or more of the control and data signals 118c between the safety sensors module 120 and the electromagnetic energy receiver 200.

Optionally, one or both of the electromagnetic energy receiver 200 and the energy conversion component 202 includes a particularly formed first opto-mechanical coupling 202a that receives the first (primary) fiber-based conduit 104a. Separately or cooperatively, the electromagnetic energy receiver 200, the energy conversion component 202, and the first opto-mechanical coupling 202a receive and direct the laser light 122b toward one or more energy conversion sub-components of the energy conversion component 202.

Optionally, the electromagnetic energy receiver 200 also includes a particularly formed second opto-mechanical coupling 202b that receives the second (secondary) fiber-based conduit 104b. And separately or cooperatively, an optical element 202c, such as a prism, and the second opto-mechanical coupling 202b receive and direct the secondary laser light signal 118d toward the safety sensors module 120.

In some cases, the energy conversion sub-components of the energy conversion component 202 includes one or more photovoltaic (PV) cells. In some of these embodiments, the primary fiber-based conduit 104a (e.g., an optical fiber) coupled to the electromagnetic energy receiver 200 emits light generated by and passed from the electromagnetic energy transmitter 102. In some of the cases where light is emitted from the primary fiber-based conduit 104a, the light is spread radially after reflecting off of an optical element, which may sometimes be referred to as an optical "spike." Here, the reflected light will be directed onto the PV cells of the energy conversion component 202. In some other cases where light is emitted from the primary fiber-based conduit 104a, the light proceeds in a generally linear path from the fiber-based conduit 104a. Here, the light may pass through one or more optical elements, with or without any substantial reflection, and with or without any substantial refraction, directly onto the PV cells. Other structures and arrangements to convey the high-flux energy toward the energy conversion component 202 are also considered.

Power-over-fiber (PoF) systems as discussed herein enclose the high-flux energy (e.g., laser light) along its entire path, from the electromagnetic energy transmitter 102 (e.g., high-flux source, laser source, and the like) through the primary fiber-based conduit 104a to the fully-enclosed electromagnetic energy receiver 200. As such, the PoF system 100 does not deliberately (e.g., purposely, intentionally, willfully, and the like) allow any high-flux energy (e.g., laser light) to escape. When this is the case, the PoF system 100 is safe at one level of description. In order to increase safety, however, the PoF system 100 described herein includes a mechanism to also shut off or otherwise prohibit high-flux energy 122b (e.g., laser light) from exiting the electromagnetic energy transmitter 102 if the fiber-based conduit 104a, 104b, or any other part of the high-flux energy path, is damaged in such a way that that high-flux energy 122b can leak out of the intended path.

There is a need for such a safety system as described herein for several reasons recognized by the inventor. For example, the inventor has recognized that the fiber-based conduit is generally more vulnerable, fragile, and otherwise more easily damaged than either the electromagnetic energy transmitter 102 or the electromagnetic energy receiver 200. In addition, the inventor has recognized that in some cases, the signal conduit 104 may travel a significant distance (e.g., 500 feet, 1000 feet, 5000 feet, or more). In these cases, because the electromagnetic energy transmitter 102 may be physically separated from the electromagnetic energy receiver 200 by a great distance, an electronic sensor-based system located at either the electromagnetic energy transmitter 102 or the electromagnetic energy receiver 200 may not be effective. Further still, it has been recognized that the electromagnetic energy transmitter 102 may not be in line of sight of the electromagnetic energy receiver 200, and in fact, there may be any number of obstacles between the electromagnetic energy transmitter 102 and the electromagnetic energy receiver 200. What is more, if a safety system is implemented with electronic, electro-mechanical, or some other electric-energy based safety system, and if that safety system relies on converted energy from the electromagnetic energy receiver 200, then any failure that causes a loss of power at the electromagnetic energy receiver 200 may also cause the safety system itself to fail. These circumstances may each benefit from the safety system described herein.

In the PoF system 100 embodiment of FIG. 1, the fiber-based conduit 104b is a separate and distinct "safety" fiber that connects the electromagnetic energy transmitter 102 to the electromagnetic energy receiver 200 via at least one safety sensor. This safety fiber acts as a conduit for reflected light to return toward the electromagnetic energy transmitter 102. An electromagnetic radiation-based sensor of the safety sensors module 120 can detect the reflected light, and a processor associated with the electronics control module 116 can determine whether the light signal or the absence thereof is indicative of a problem. That is, in some cases, if the electromagnetic radiation-based safety sensors module 120 determines that the reflected light drops below a determined threshold, a control signal may be asserted that operates to reduce or shut off the high-flux energy diode laser source 112, to electro-mechanically shade an output of the electromagnetic energy transmitter 102, or in some other way prevent high-flux energy from entering the fiber-based conduit 104a.

At the electromagnetic energy receiver 200, the fiber-based conduit 104b may be physically arranged to sample some portion of the high-flux light energy 122b that is reflected by one or more elements of the energy conversion component 202. In some cases the fiber-based conduit 104b is coupled to an enclosure of the electromagnetic energy receiver 200 in such a way that light reflected from one or more PV cells of the energy conversion component 202 enters the fiber-based conduit 104b. In these or in other cases, an optical element 202c is arranged to facilitate reflected light entry into the fiber-based conduit 104b.

One challenge lies in sampling enough of the high-flux light energy 122b in a way that fits within the numerical aperture (NA) of the fiber-based conduit 104b. In other words, light which enters the fiber-based conduit 104b at an angle that is steeper than the angle of total internal reflection of the fiber-based conduit 104b would be lost instead of being routed toward the safety sensor module 120.

Another challenge is that it can also be difficult to sample light in the electromagnetic energy receiver 200 consistently. If light that enters the electromagnetic energy receiver 200 is not sampled consistently, then the safety signal produced may not be reliable. In the present disclosure, various structures and methods are described to permit enough light to be captured and returned. In some cases, mechanisms are described that couple the fiber-based secondary conduit 104b to the safety sensors module 120 associated with the electromagnetic energy transmitter 102 in such a way as to locate the secondary fiber-based conduit 104b on the electromagnetic energy receiver 200 such that it is easy for a user to connect and convenient relative to the primary fiber-based conduit 104a.

In many cases, the primary and secondary fiber-based conduits 104a, 104b will be bundled together inside the same jacket for ease of handling and so that both conduits experience similar stresses. Other conduits such as communications conduit 104c may also be bundled inside the same jacket.

In some embodiments, the electromagnetic energy receiver 200 optionally includes one or more optical structures. The optical structures may include a first opto-mechanical coupling 202a, a second opto-mechanical coupling 202b, and an optical element 202c. The optical structures may include one or more lenses or other refractive elements that shape the high-flux energy (e.g., laser light) for the energy conversion component 202 (e.g., PV cells). While refractive elements in some cases are formed with at least one anti-reflection coating that improves system efficiency, some small fraction of the incident light will still reflect from the anti-reflection coated optical elements. If the first surface of the first optical element in the high-flux energy 122b path within the electromagnetic energy receiver 200 is flat, then the reflected portion of the high-flux energy will continue to spread and propagate in the same manner as the high-flux energy 122b that exited the fiber-based conduit 104a.

In at least one embodiment of PoF system 100 of FIG. 1, an optical element 202c is arranged in the electromagnetic energy receiver 200 near the first opto-mechanical coupling 202a. The optical element 202c in some cases is a periscope-style prism. The arrangement of optical element 202c is such that the high-flux energy 122b beam is not blocked as it traverses the space between the opto-mechanical coupling 202a and the energy conversion components in the electromagnetic energy receiver 200. Yet, the arrangement of optical element 202c is also such that optical element 202c is close to the axis of the primary fiber-based conduit 104a (i.e., the axis of the high-flux energy 118c power beam). Such an arrangement as illustrated in the figures and specification of the present disclosure increases the amount of energy (e.g., light) collected. The amount of energy collected may include energy (e.g., light) specifically reflected from the first optical surface, and any other energy (e.g., light) that traverses the full optical path toward the energy conversion component (e.g., PV cells), but which gets reflected back towards the fiber-based conduit 104b. Energy (e.g., light) entering the optical element 202c (e.g., a prism) may come from reflections off of the optical elements, energy conversion components 202, scattering from dust, or reflections from other internal surfaces of the electromagnetic energy receiver 200. In designs that include a particular prism optical element 202c, the prism specifications, including its location in the electromagnetic energy receiver 200, may be arranged to capture energy reflected from a first optical element, because that first optical element may be arranged closest to the prism, which may thereby be the most intense.

Figure 2:
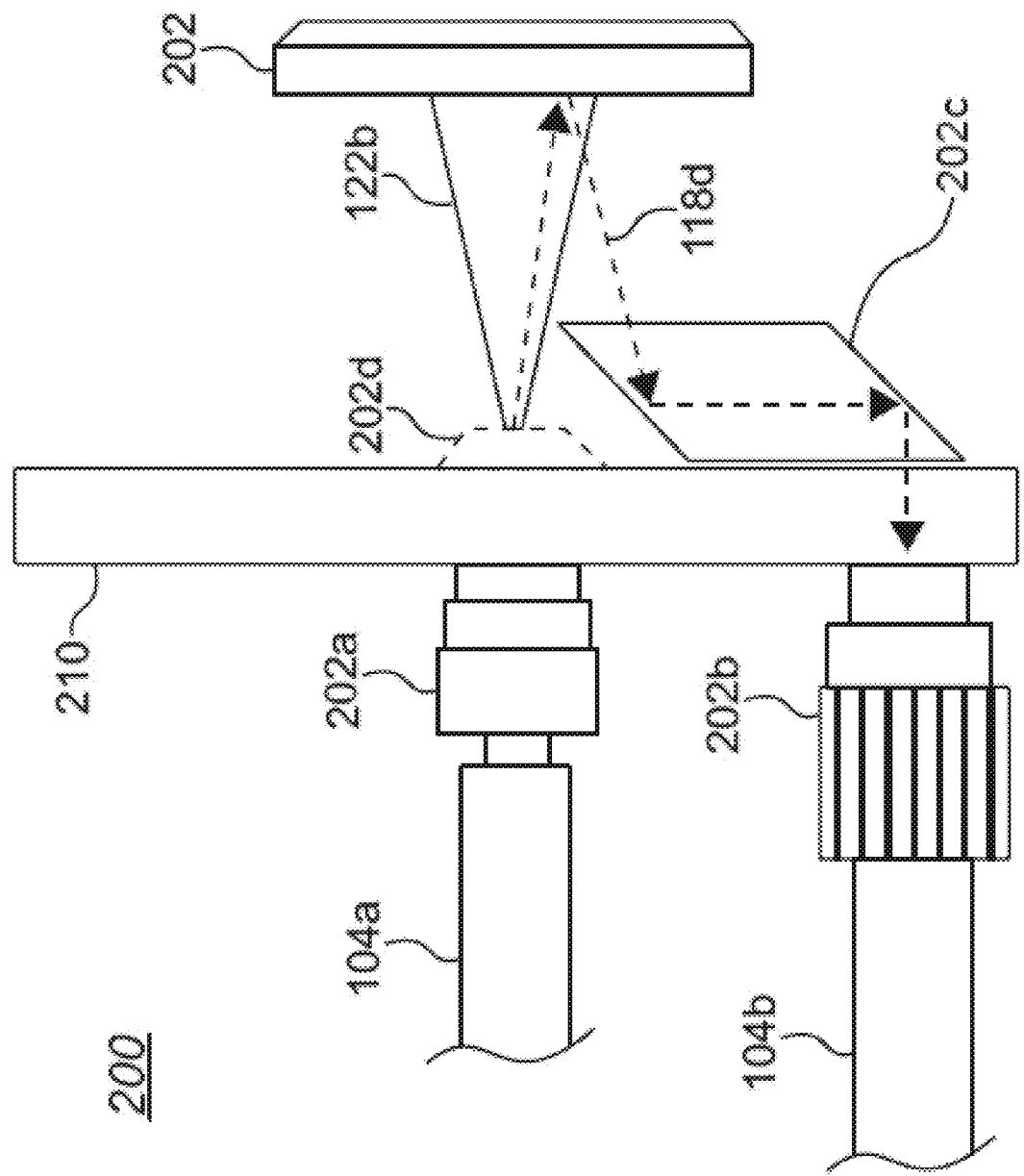
FIG. 2 is a portion of a PoF electromagnetic energy receiver embodiment.

FIG. 2 is a portion of a PoF electromagnetic energy receiver embodiment 200. A first (primary) fiber-based conduit 104a is opto-mechanically coupled to a housing 210 of the electromagnetic energy receiver embodiment 200. An opto-mechanical coupling 202a may be screwed, clamped, compression fit, friction fit, or otherwise arranged to permanently or removably attach the fiber-based conduit 104a to the electromagnetic energy receiver embodiment 200. Optionally, an additional optical element 202d structure may cooperate with the opto-mechanical coupling 202a to pass, reflect, refract, or otherwise advance energy 122b (e.g., light) toward the energy conversion component 202 (e.g., PV cells) or reflect at least a portion of energy 122b back toward the fiber-based conduit 104b. The optional optical element 202d may be located proximate to an inside surface of the housing 210 of the electromagnetic energy receiver embodiment 200. The optional additional optical element 202d structure may provide one or more of thermo-coupling properties, optical properties, mechanical properties, or some other features.

As evident in FIG. 2, a high-flux energy beam 122b passed through the fiber-based conduit 104a is directed toward one or more surfaces of an energy conversion component 202. The high-flux energy beam 122b may be considered as primary light from the high-flux electromagnetic energy transmitter 102. A portion of the high-flux energy beam 122b is reflected from a surface of an energy conversion component 202 as a secondary light signal 118d. In the embodiment of FIG. 2, the reflected secondary light signal 118d is collected and directed via an optical element 202c into the second fiber-based conduit 104b. The optical element 202c in FIG. 2 is illustrated as a parallelepiped prism, but other structures, shapes, and types of optical elements are contemplated. In at least one case, the optical element 202c is arranged as a dichroic to selectively pass light of a first wavelength and reflect or otherwise prohibit the direct passage of light having a second wavelength.

The second fiber-based conduit 104b is also opto-mechanically coupled to housing 210 of the electromagnetic energy receiver embodiment 200 via an opto-mechanical coupling 202b. The opto-mechanical coupling 202b may be screwed, clamped, compression fit, friction fit, or otherwise arranged to permanently or removably attach the fiber-based conduit 104b to the electromagnetic energy receiver embodiment 200.

Figure 3:
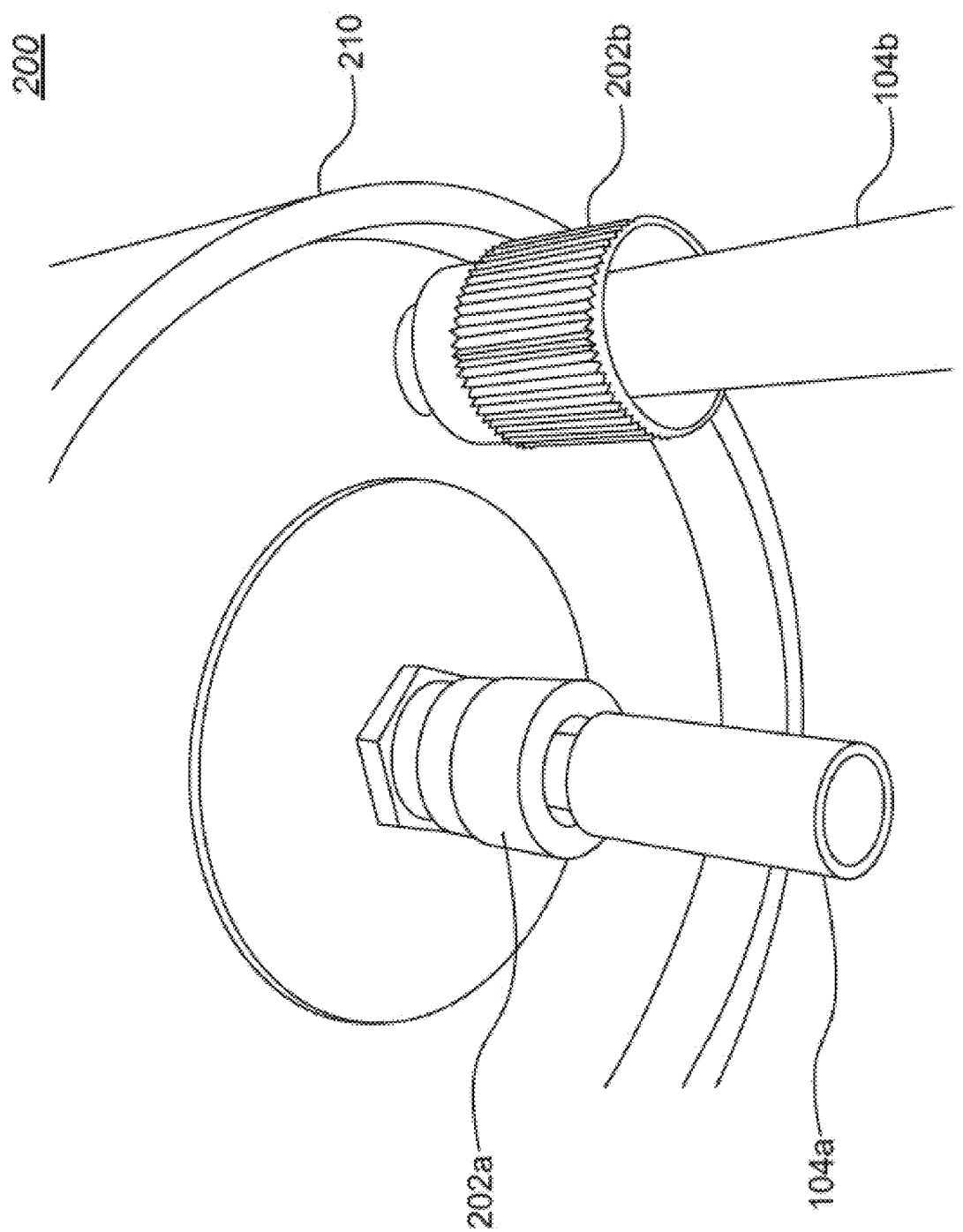
FIG. 3 is view of the PoF electromagnetic energy receiver portion of FIG. 2 from a different perspective.

FIG. 3 is view of the PoF electromagnetic energy receiver 200 portion of FIG. 2 from a different perspective. This embodiment illustrated in FIG. 2 shows that the separation between the two fiber-based conduits 104a, 104b is adequately arranged for insertion and manual tightening of a coupling mechanism (e.g., nuts) of opto-mechanical couplings 202a, 202b, respectively. The distance of an adequate arrangement may be based on the ability of an average sized, un-gloved hand to hand-tighten both of the two fiber-based conduits 104a, 104b. For example, in some cases, the central axis of the primary fiber-based conduit 104a is separated from the central axis of the secondary fiber-based conduit 104b by at least one inch. In other cases, the outside surface of the primary fiber-based conduit 104a is separated from the outside surface of the secondary fiber-based conduit 104b by less than one inch, less than one half inch, or at least two inches. Any other desirable dimensions may also be selected.

Figure 4:
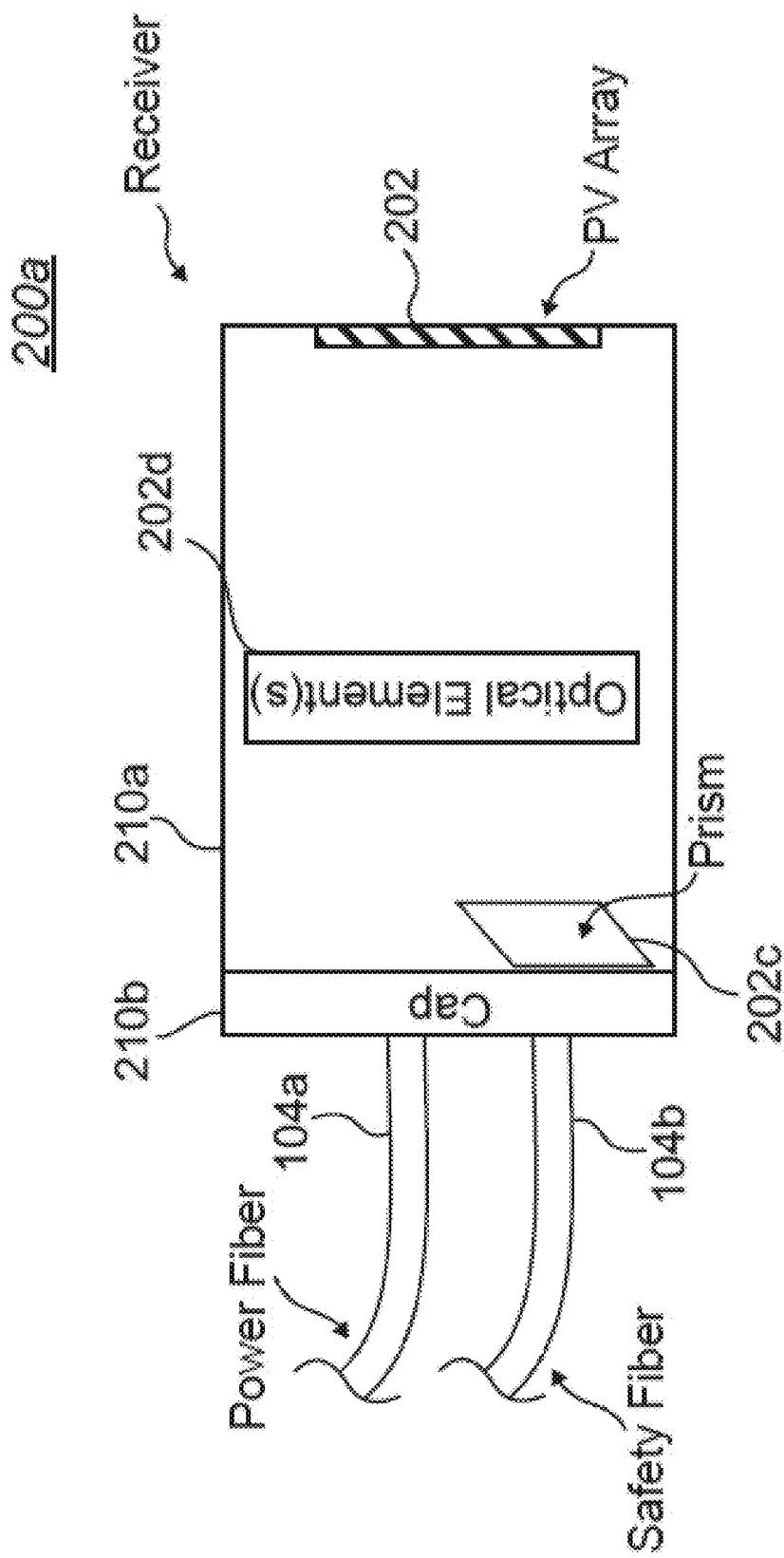
FIG. 4 is a portion of another PoF electromagnetic energy receiver embodiment.

FIG. 4 is a portion of another PoF electromagnetic energy receiver 200a embodiment. In the embodiment, a first fiber-based conduit 104a couples a high-flux electromagnetic energy transmitter 102 (FIG. 1) to an electromagnetic energy receiver 200a. The first fiber-based conduit 104a is arranged to pass high-flux light (e.g., laser light) from the high-flux electromagnetic energy transmitter 102 to the electromagnetic energy receiver 200a. Also in the embodiment, a second fiber-based conduit 104b couples the electromagnetic energy receiver 200a to a light-detecting sensor (not shown). The second fiber-based conduit 104b is arranged to pass at least some light from the electromagnetic energy receiver 200a to the light-detecting sensor. In this case, a processing unit integrated in, or otherwise associated with, the high-flux electromagnetic energy transmitter 102 is arranged to control an output of the high-flux energy 122b from the high-flux electromagnetic energy transmitter 102. Control of the high-flux electromagnetic energy output is based on a control signal from the light-detecting sensor generated in response to the secondary light signal 118d passed through the second fiber-based conduit 104b.

The electromagnetic energy receiver 200a of FIG. 4 optionally includes optical element 202c and optical element 202d. Other optical elements are also contemplated and not illustrated, however, so as to avoid obscuring various portions of the figure. The electromagnetic energy receiver 200a also includes an energy conversion component 202 that is arranged to convert light to electricity.

In some embodiments, the electromagnetic energy receiver 200a includes a substantially cylindrical housing having a housing body 210a portion and a housing cap 210b portion. In some of these embodiments, the diameter of the substantially cylindrical housing is between about 0.25 inches and about fourteen (14) inches. Other shapes and sizes of electromagnetic energy receiver housings are contemplated. For example, housing 210a may have a cross-section that is square, rectangular, ovular, hexagonal, octagonal, or some other shape. In some cases, the cross-section is selected so that a plurality of electromagnetic energy receivers 200a can be arranged cooperatively in a given space.

In some embodiments, the housing cap 210b has an inside dimension (e.g., diameter) that mates with an outside dimension (e.g., diameter) of the housing body 210a. In some embodiments, the housing cap 210b has an outside dimension (e.g., diameter) that mates with an inside dimension (e.g., diameter) of the housing body 210a. In still other embodiments, the housing body 210a and the housing cap 210b have substantially a same dimension (e.g., diameter). In these cases, the housing body 210a and housing cap 210b are cooperatively joined by a clamping mechanism or some other like means.

In the embodiment of FIG. 4, and in other contemplated embodiments, some of which are described in the present disclosure, the first and second fiber-based conduits 104a, 104b are generally structured as wire, cable, or some other like medium. The cross section of the first and second fiber-based conduits 104a, 104b may be circular, elliptical, oval, rectangular, hexagonal, or have some other shape. In some cases, the first and second fiber-based conduits 104a, 104b are arranged for rotational coupling (e.g., via screw-like threads), by hand, to first and second opto-mechanical couplings 202a, 202b, respectively. The fiber-based conduits described herein may have a single optical strand or a plurality of optical strands (e.g., 2, 3, 7, 16, 19, 64, 256, or more optical strands). In cases where a fiber-based conduit has a plurality of strands, the strands may be woven, spiraled, twisted, or formed in some other shape. The fiber-based conduit may be any suitable length, diameter, weight, or other dimension. The fiber-based conduit may have structures or other properties to provide strength (e.g., metal sheathing, multiple jackets, or the like), resiliency to substances or abrasion, rigidity, flexibility, weight, or any other desirable characteristics.

Figure 5:
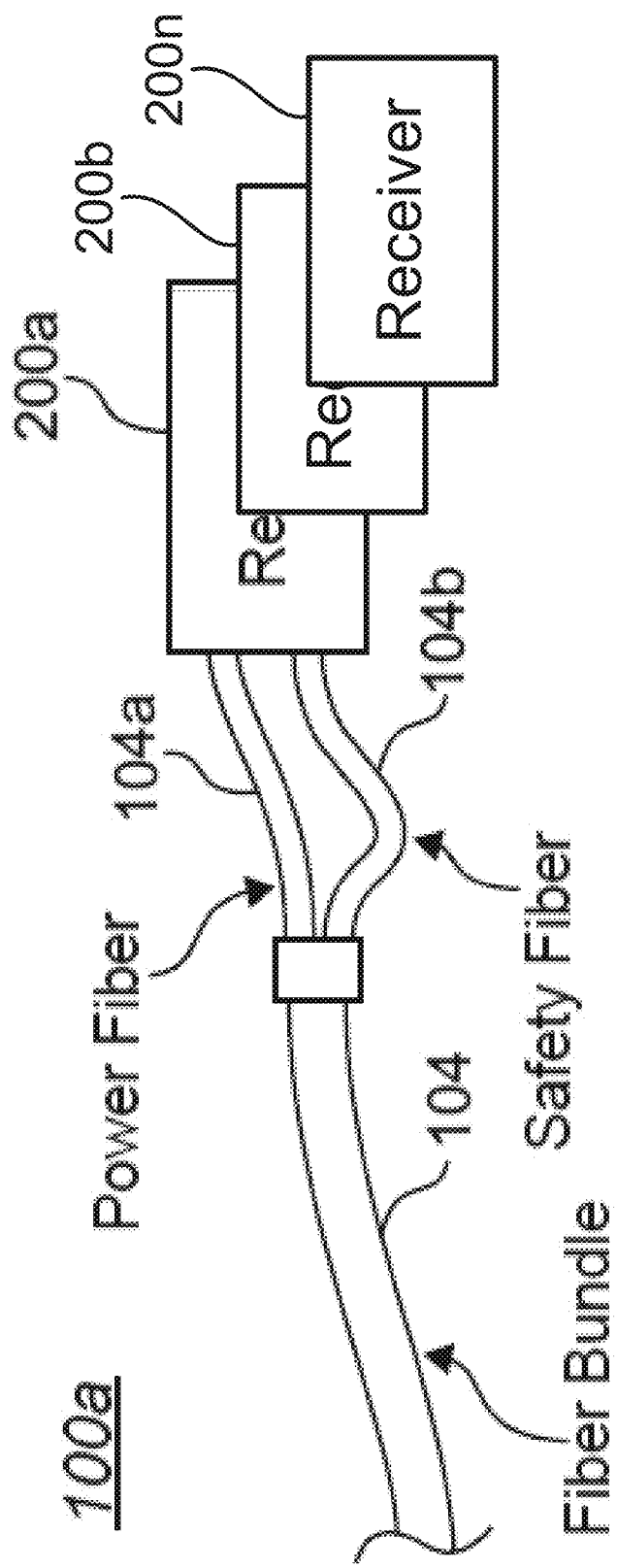
FIG. 5 is a PoF electromagnetic energy receiver embodiment having a bundled multi-fiber medium coupled thereto.

In FIG. 5, one or more PoF electromagnetic energy receiver embodiments 200a, 200b, 200n have a signal conduit 104 coupled thereto. Two or more electromagnetic energy receivers may share a single conduit 104. Alternatively, each electromagnetic energy receiver may have a single conduit 104 coupled thereto. In FIG. 5, a single conduit 104 is illustrated for brevity. The signal conduit 104 in FIG. 5 is arranged as a bundled multi-fiber medium. In some cases, the conduit 104 carries a first (primary) fiber-based conduit 104a and a second (secondary) fiber-based conduit 104b in a common jacket, sheath, or other structure. In other cases, the conduit 104 includes only the primary fiber-based conduit 104a, and a light energy signal (e.g., light energy signal 122 of FIG. 1) and a safety light signal (e.g., secondary light signal 118d of FIG. 1) share the conduit 104a. In the PoF system 100a of FIG. 5, a second end of the signal conduit 104 is coupled to a high-flux electromagnetic energy transmitter 102 (FIG. 1).

Figure 6:
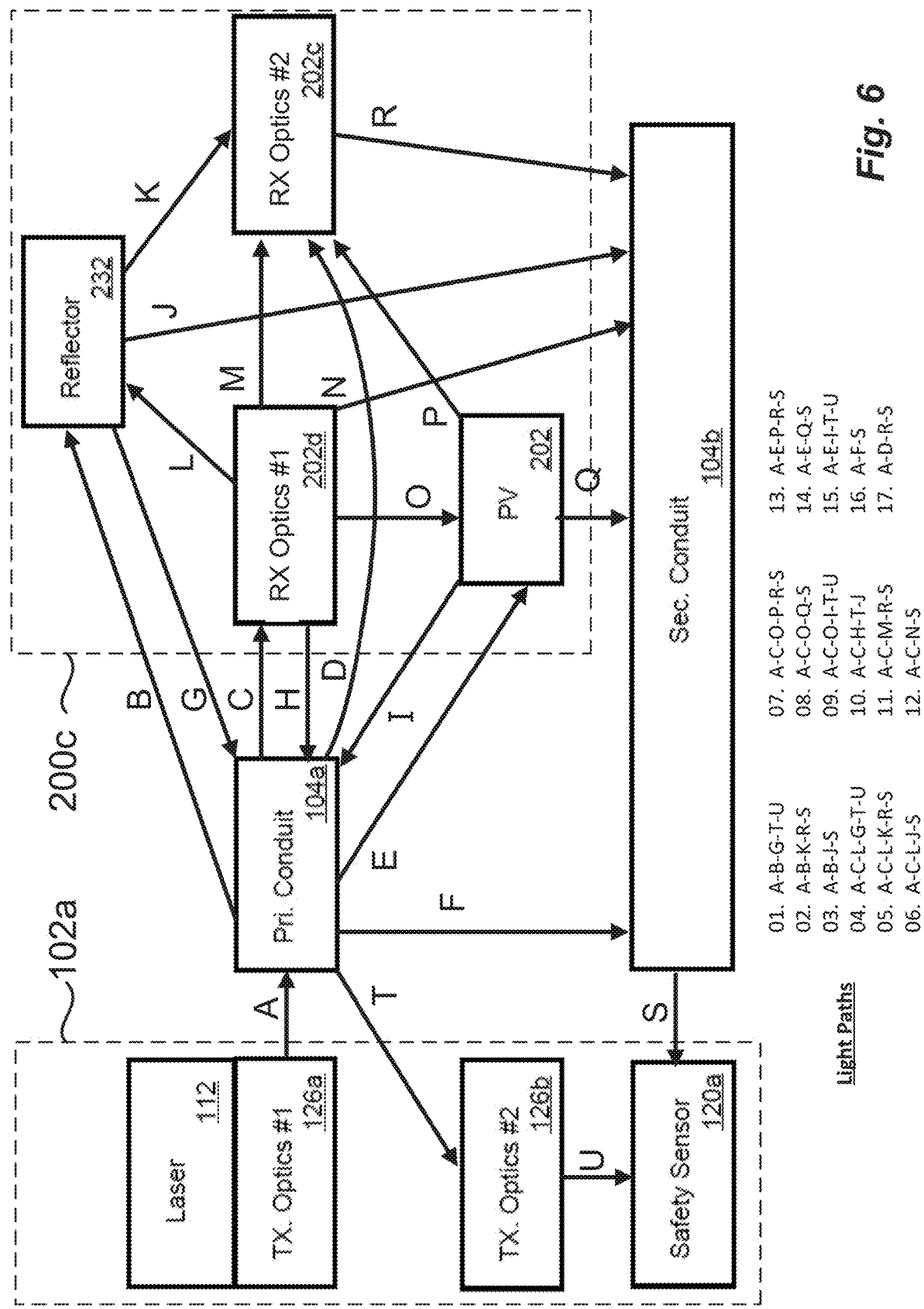
FIG. 6 is a representation of light path embodiments illustrating how a portion of high-flux energy may be captured from a high-flux light signal and directed back toward a safety sensors module.

FIG. 6 is a representation of light path embodiments illustrating how a portion of high-flux energy or lower-flux energy of a separate wavelength may be captured from a high-flux light signal and directed back toward a safety sensors module 122. In FIG. 6, an electromagnetic energy transmitter 102a embodiment and an electromagnetic energy receiver 200c embodiment are coupled together by a primary fiber-based conduit 104a and an optional secondary fiber-based conduit 104b.

The electromagnetic energy transmitter 102a embodiment of FIG. 6 includes first transmitter optical structures 126a, optional second transmitter optical structures 126b, and a safety sensor module 120a. Other structures of the electromagnetic energy transmitter 102a embodiment are not shown. The first transmitter optical structures 126a may be along the lines of the beam-shaping optics 126 of FIG. 1.

The electromagnetic energy receiver 200c embodiment of FIG. 6 includes at least one energy conversion component 202, a first optional optical element 202d, a second optional optical element 202c, and an optional reflecting device 232. The reflecting device may be a dedicated reflecting device such as a mirror-polished structure, a passive reflecting device such as a surface of any one of the other structures in the electromagnetic energy receiver 200c (e.g., at least one energy conversion component 202, a first optional optical element 202d, and a second optional optical element 202c), or some other reflecting device. In some cases, reflecting device 232 can be a matte reflecting surface, optionally a metal, or another type of surface that is not a lens or mirror.

In FIG. 6, high-flux energy (e.g., collimated light 122a) is transmitted from a diode laser source 112 into the first transmitter-based optical structures 126a, which may be along the lines of beam-shaping optics 126 (FIG. 1). A plurality of light path segments between the first transmitter-based optical structures 126a and the safety sensor module 120a are shown in FIG. 6.

A first light path segment "A" represents high-flux energy passing from the first transmitter-based optical structures 126a into the first (primary) fiber-based conduit 104a.

A second light path segment "B" represents high-flux energy passing from the first (primary) fiber-based conduit 104a to a reflecting device 232 of the electromagnetic energy receiver 200c.

A third light path segment "C" represents high-flux energy passing from the first (primary) fiber-based conduit 104a to an optional first optical element 202d in the electromagnetic energy receiver 200c.

A fourth light path segment "D" represents high-flux energy passing from the first (primary) fiber-based conduit 104a to an optional second optical element 202c in the electromagnetic energy receiver 200c.

A fifth light path segment "E" represents high-flux energy passing from the first (primary) fiber-based conduit 104a to the energy conversion component 202 in the electromagnetic energy receiver 200c.

A sixth light path segment "F" represents high-flux energy passing from the first (primary) fiber-based conduit 104a directly to the second (secondary) fiber-based conduit 104b. In this case, for example, the first transmitter-based optical structures 126a may separate or otherwise condition a portion of the high-flux energy for direct passage from the electromagnetic energy transmitter 102a to the electromagnetic energy receiver 200c and back to the electromagnetic energy transmitter 102a.

A seventh light path segment "G" represents at least a portion of high-flux energy returning from the optional reflecting device 232 in the electromagnetic energy receiver 200c back to the first (primary) fiber-based conduit 104a.

An eighth light path segment "H" represents at least a portion of high-flux energy passing from the first optional optical element 202d in the electromagnetic energy receiver 200c back to the first (primary) fiber-based conduit 104a.

A ninth light path segment "I" represents at least a portion of high-flux energy passing from the energy conversion component 202 in the electromagnetic energy receiver 200c to the first (primary) fiber-based conduit 104a.

A tenth light path segment "J" represents at least a portion of high-flux energy passing from the reflecting device 232 in the electromagnetic energy receiver 200c to the second (secondary) fiber-based conduit 104b.

A eleventh light path segment "K" represents at least a portion of high-flux energy passing from the reflecting device 232 in the electromagnetic energy receiver 200c to the second optical element 202c in the electromagnetic energy receiver 200c.

A twelfth light path segment "L" represents at least a portion of high-flux energy passing within the electromagnetic energy receiver 200c from the from the first optional optical element 202d to the reflecting device 232.

An thirteenth light path segment "M" represents at least a portion of high-flux energy passing from the first optional optical element 202d in the electromagnetic energy receiver 200c to the second optical element 202c in the electromagnetic energy receiver 200c, A fourteenth light path segment "N" represents at least a portion of high-flux energy passing from the second optional optical element 202d in the electromagnetic energy receiver 200c to the second (secondary) fiber-based conduit 104b.

A fifteenth light path segment "O" represents high-flux energy passing from the second optional optical element 202d in the electromagnetic energy receiver 200c to the energy conversion component 202 in the electromagnetic energy receiver 200c.

A sixteenth light path segment "P" represents at least a portion of high-flux energy passing from the energy conversion component 202 in the electromagnetic energy receiver 200c to the first optical element 202c in the electromagnetic energy receiver 200c.

A seventeenth light path segment "Q" represents at least a portion of high-flux energy passing from the energy conversion component 202 in the electromagnetic energy receiver 200c to the second (secondary) fiber-based conduit 104b.

A eighteenth light path segment "R" represents at least a portion of high-flux energy passing from the second optical element 202c in the electromagnetic energy receiver 200c to the second (secondary) fiber-based conduit 104b.

A nineteenth light path segment "S" represents at least a portion of high-flux energy passing from the second (secondary) fiber-based conduit 104b to the safety sensors module 120a of the electromagnetic energy transmitter 102a.

An twentieth light path segment "T" represents at least a portion of high-flux energy passing from the first (primary) fiber-based conduit 104a to the optional second transmitter optical structures 126b in the electromagnetic energy transmitter 102a.

A twenty-first light path segment "U" represents at least a portion of high-flux energy passing from the optional second transmitter optical structures 126b in the electromagnetic energy transmitter 102a to the safety sensors module 120a in the electromagnetic energy transmitter 102a.

Though not shown so as to avoid cluttering FIG. 6 and thereby obscuring the wide flexibility of the present disclosure, it is recognized that any other desirable light path segments may also be formed. For example, light path segments may also be formed in the electromagnetic energy receiver 202c from the optional first or second optical elements 202d, 202c to the reflecting device 232, from the energy conversion device 202 to the reflecting device 232, or between any other optical structures represented in FIG. 6 or additional optical structures not expressly shown in FIG. 6.

Considering the entire light paths that a portion of high-flux energy may take in order to be directed from the electromagnetic energy transmitter 102a back toward a safety sensors module 122 in the electromagnetic energy transmitter 102a, Table 1 is presented.

TABLE 1

Paths Light May Take From Transmitter to Safety Sensor Module

| Path Number | Path |
|---|---|
| 01 | A-B-G-T-U |
| 02 | A-B-K-R-S |
| 03 | A-B-J-S |
| 04 | A-C-L-G-T-U |
| 05 | A-C-L-K-R-S |
| 06 | A-C-L-J-S |
| 07 | A-C-O-P-R-S |
| 08 | A-C-O-Q-S |
| 09 | A-C-O-I-T-U |
| 10 | A-C-H-T-J |
| 11 | A-C-M-R-S |

TABLE 1-continued

Paths Light May Take From Transmitter to Safety Sensor Module

| Path Number | Path |
|---|---|
| 12 | A-C-N-S |
| 13 | A-E-P-R-S |
| 14 | A-E-Q-S |
| 15 | A-E-I-T-U |
| 16 | A-F-S |
| 17 | A-D-R-S |

Several optional full "paths" that light may take in order to implement a safety system are represented in Table 1 and FIG. 6 as a plurality of light path segments. It is recognized that in many safety system embodiments, many of the optional components described herein will not be present or will not be arranged to carry out the features of the safety systems described herein. For example, in some embodiments, the electromagnetic energy receiver 200c will not be constructed with a reflecting device 232. In those embodiments, the light path segments "B," "G," "L," "J," and "K" will not exist. Accordingly, one of skill in the art will recognize that FIG. 6 is simply a representation of many light path segment embodiments that can be arranged, and in actual PoF system installations, only a small number (e.g., one or two) full light paths will be arranged. To illustrate such an embodiment, in at least one exemplary case, an electromagnetic energy receiver 200c is constructed with second optional optics element 202c arranged as part of the safety system light path, but reflecting device 232 is not present and neither the first optical element 202d nor the energy conversion device 202 participate in the safety system to return a portion of high-flux energy back toward the safety sensors module 120a of the electromagnetic energy transmitter 102a. By way of this exemplary embodiment, one of skill in the art will recognize that FIG. 6 and Table 1 represent many light paths can be formed from any desirable number of segments, but each possible light path is not described in the present disclosure.

The one or more paths that light may take from a high-flux transmitter to a safety module as in Table 1 and FIG. 6 may be implemented with structures described in the present disclosure. In some embodiments, the light will travel in only a single path. In some embodiments, light may travel in two or more paths. That is, in some cases, an electromagnetic energy transmitter 102a, an electromagnetic energy receiver 200c, or both the electromagnetic energy transmitter 102a and electromagnetic energy receiver 200c will be formed with cooperating optical elements arranged to pass a portion of the high-flux light produced in the electromagnetic energy transmitter 102a back to the safety sensors module 120a of the electromagnetic energy transmitter 102a.

FIGS. 7A-7H may collectively be referred to as FIG. 7. These figures illustrate exemplary structures that may be arranged to implement one or more of the light path segments of the present disclosure (e.g., FIG. 6).

Figure 7A:
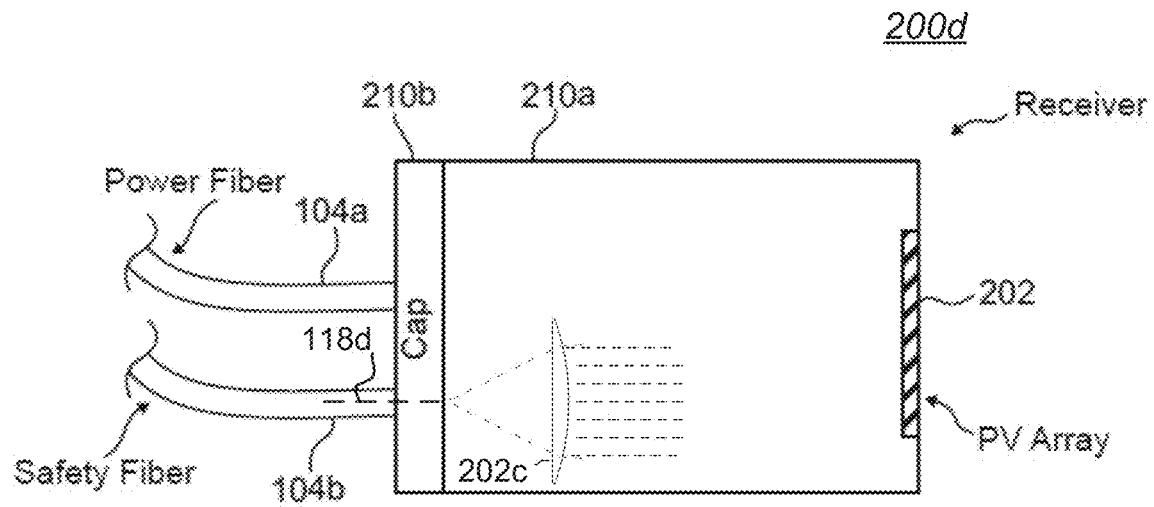
FIG. 7A is an electromagnetic energy receiver embodiment where the second optional optical element is arranged as a lens.

FIG. 7A is an electromagnetic energy receiver 200d embodiment where the second optional optical element 202c is arranged as a lens. The lens may be spherical, aspherical, rotationally symmetric, or formed with any other desirable characteristics and properties. The lens collects portions of high-flux light from any number of reflections, refractions, collections, distributions, or the like within the electromagnetic energy receiver 200c. The light collected in the lens is focused or otherwise collected to pass into the second (secondary) fiber-based conduit 104b as a secondary light signal 118d (FIG. 1).

Figure 7B:
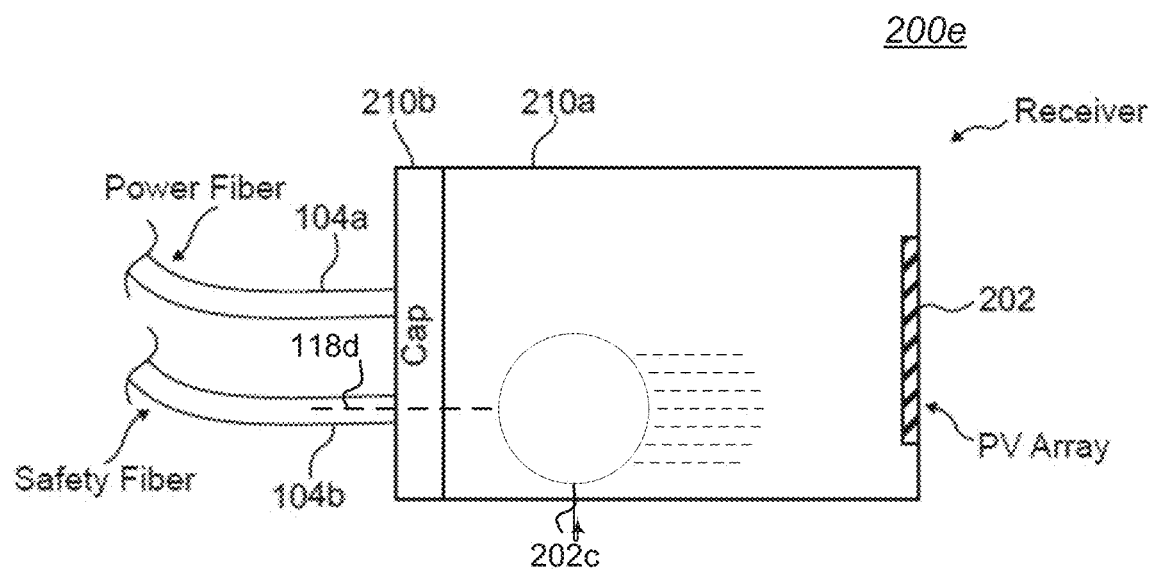
FIG. 7B is another electromagnetic energy receiver embodiment along the lines of FIG. 7A wherein the second optional optical element is arranged as a ball lens.

FIG. 7B is another electromagnetic energy receiver 200e embodiment along the lines of FIG. 7A wherein the second optional optical element 202c is arranged as a ball lens. One of skill in the art will recognize that other suitable optical element arrangements may also be formed.

Figure 7C:
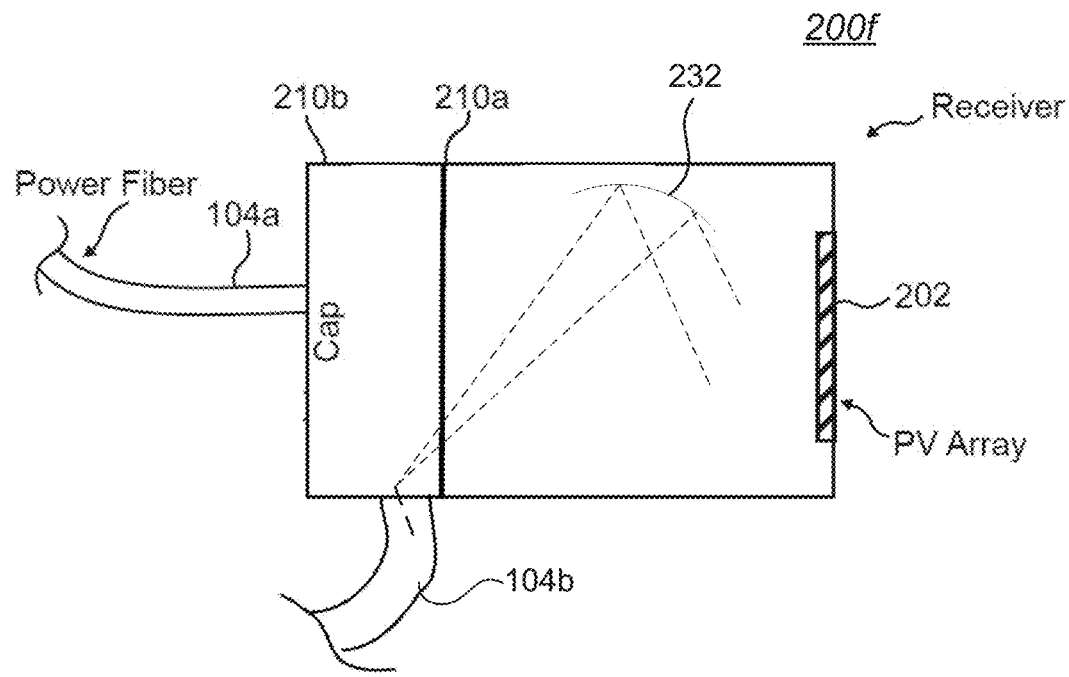
FIG. 7C is yet one more electromagnetic energy receiver embodiment along the lines of FIG. 7A wherein a parabolic reflecting device is arranged to direct a portion of reflected or otherwise available high-flux energy toward a secondary conduit.

FIG. 7C is yet one more electromagnetic energy receiver embodiment 200f along the lines of FIG. 7A wherein a parabolic reflecting device 232 embodiment is arranged to direct a portion of high-flux energy toward a secondary conduit as a secondary light signal 118d (FIG. 1). In the embodiment, the parabolic reflecting device 232 may be arranged as a mirror, a lens, or in some other form. The parabolic reflecting device 232 may be placed in any suitable location within the electromagnetic energy receiver embodiment 200f, or a plurality of parabolic reflecting devices may be used. In the electromagnetic energy receiver embodiment 200f of FIG. 7C, the position of the second (secondary) fiber-based conduit 104b has changed, and the housing cap 210b has been enlarged and formed with other modifications. Accordingly, the illustration of FIG. 7C conveys to one of skill in the art that the formation of the housing 210 or its components can be arranged as desired. The illustration further teaches one of skill in the art that the position, orientation, size, and other characteristics of the first (primary) fiber-based conduit 104a and the second (secondary) fiber-based conduit 104b have been contemplated in many different ways.

Figure 7D:
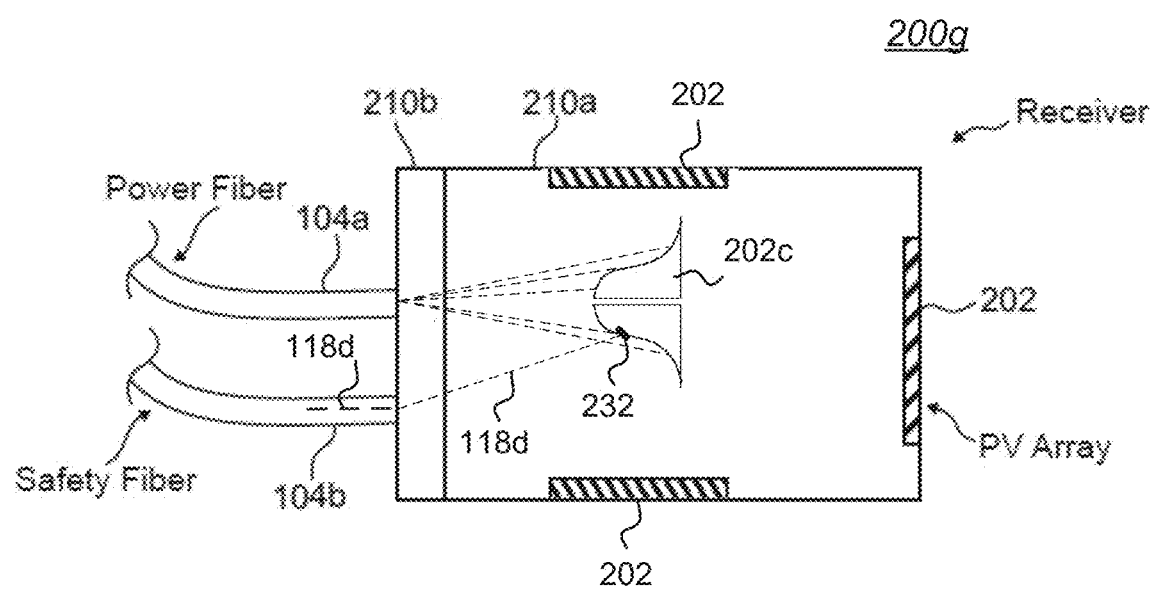
FIG. 7D is an electromagnetic energy receiver embodiment that employs a first optical element arranged as a particular type of optical spike having a second optical element formed therein.

FIG. 7D is an electromagnetic energy receiver embodiment 200g that employs a first optical element 202d arranged as a particular type of optical spike having a second optical element 202c formed therein. Integrated in the optical spike is a purposefully crafted reflecting device 232.

The optical element 202c of FIG. 7D is arranged as an expander having an axis and a curved surface that is configured to reflect electromagnetic radiation away from the axis. A beam of high-flux electromagnetic radiation may emanate directly from the first (primary) fiber-based conduit 104a, or the beam may be initially shaped or otherwise modified by a first optical element (e.g., optical element 202d of FIG. 2). The high-flux radiation is desirably expanded and reflected toward one or more energy conversion components 202 that receive the expanded electromagnetic radiation and generate electricity. With the expander's curved surface, the beam of electromagnetic radiation that has a large radiation flux is converted into a beam that has a larger cross-sectional area. In at least some cases, the curved surface of the optical element 202c provides a substantially uniform distribution of radiation across the expanded cross-sectional area. With such an expanded beam, the energy conversion components 202 can efficiently convert the electromagnetic radiation into electricity. In FIG. 7D, the expanded cross-section is illustrated by a set of dashed lines, which are not provided with reference numbers so as to increase clarity of the figure. Along these lines, it is recognized that the set of dashed lines is shown to illustrate the expanding properties of the optical element, but the dashed lines do not represent the expansion of an entire light signal or the directing of light from the optical element toward the energy conversion component 202. Hence, of skill in the art will recognized that the dashed lines and cross-sectional shape of the optical element 202c are exemplary and not strictly representative.

The crafted reflecting device 232 in the optical spike embodiment of optical element 202c may be a planar mirror structure, a "flat spot," a parabolic depression, or some other non-uniformity in the surface of the optical spike. Via the reflecting device 232, a portion of high-flux radiation is directed toward the second (secondary) fiber-based conduit 104b as the secondary light signal 118d.

Figure 7E:
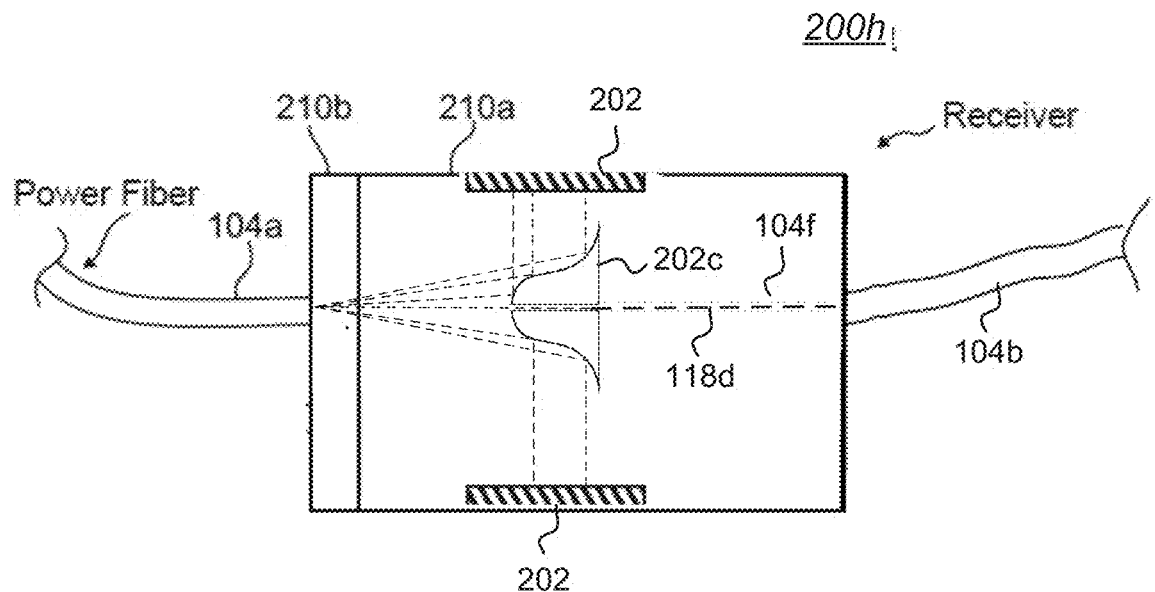
FIG. 7E is an electromagnetic energy receiver embodiment along the lines of the embodiment of FIG. 7D, wherein a light-based conduit such as a fiber is communicated through the optical spike.

FIG. 7E is an electromagnetic energy receiver embodiment 200h along the lines of the embodiment of FIG. 7D. In the electromagnetic receiver embodiment 200h, the second (secondary) fiber-based conduit 104b is arranged at yet a different location on housing body 210a. In this case, one or more safety fibers may be communicated through a second optical element 202c or integrated with the optical element in some other arrangement. In this way, the secondary light signal 118d may pass directly into the fiber-based conduit 104b. Additionally, the optical element 202c in FIG. 7E is arranged as a another type of optical spike, which permits a portion of the high-flux light to pass through the spike. The optical element 202c may have a central lens portion arranged along its axis, an aperture, or some other structure that permissibly permits a secondary light signal 118d of sufficient direction and strength to pass into a fiber-based conduit to reach the safety sensors module 120 of the electromagnetic energy transmitter 102. In some optional cases, a fiber strand 104f is arranged to pass directly to, or even through, the optical element 202c.

Figure 7F:
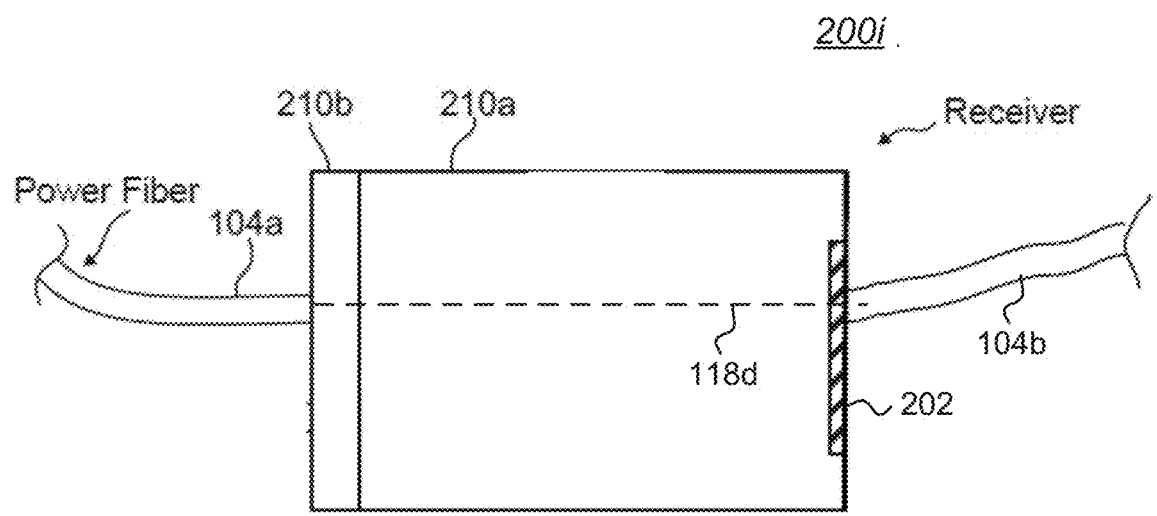
FIG. 7F is an electromagnetic energy receiver embodiment wherein a portion of the high-flux light passes through (e.g., in between cells of) an energy conversion component.

FIG. 7F is an electromagnetic energy receiver embodiment 200i wherein a portion of the high-flux light passes through (e.g., in between cells of) an energy conversion component 202. The portion of light that passes through is used as a secondary light signal 118d that is directed to the safety sensors module 120 of the electromagnetic energy transmitter 102 via the second (secondary) fiber-based conduit 104b.

Figure 7G:
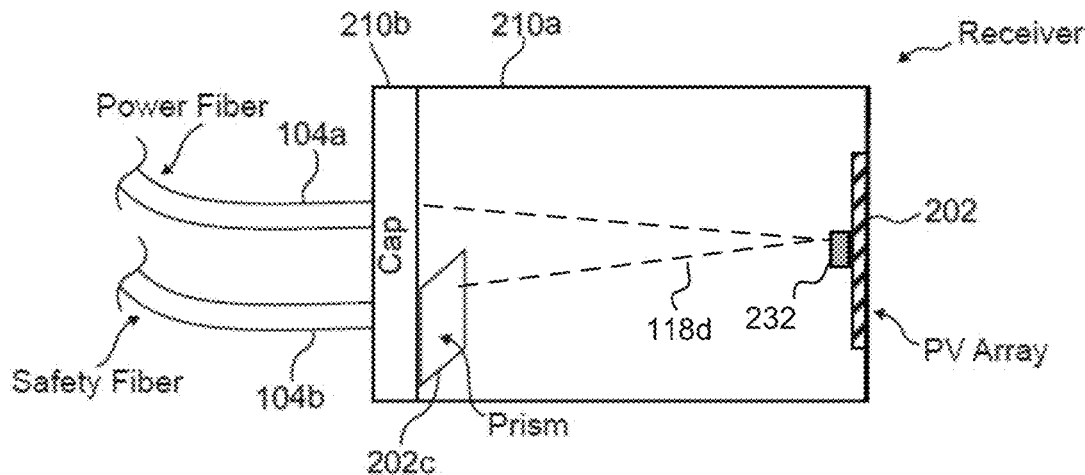
FIG. 7G is a portion of a PoF electromagnetic energy receiver along the lines of FIG. 2.

FIG. 7G is a portion of a PoF electromagnetic energy receiver along the lines of FIG. 2. In the embodiment of FIG. 7G, the energy conversion component 202 of the electromagnetic energy receiver 200j is arranged with a reflecting device 232. In the embodiment of FIG. 7G, the reflecting device 232 may be arranged on a seam between adjacent energy conversion devices, on a face of an energy conversion device, or in some other location. In some cases, the reflecting device 232 is planar, in some cases, the reflecting device 232 is parabolic, and in still other cases, the reflecting device 232 has a different configuration. In at least one case, the reflecting device 232 is a portion of the energy conversion surface coating itself. In some embodiments, the reflecting device 232 is arranged as a steerable micro-mirror (e.g., a micro-electro-mechanical (MEMs) device), and in such cases, the reflecting device 232 may be directionally controlled electronically, electromagnetically, or in some other way.

Figure 7H:
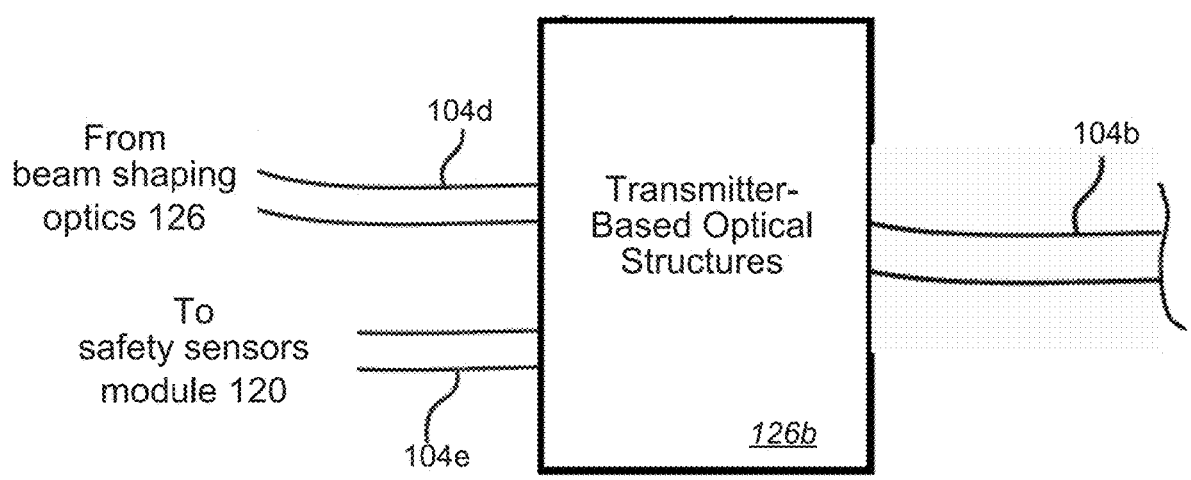
FIG. 7H is an embodiment of one or more second transmitter-based optical structures.

FIG. 7H is an embodiment of one or more second transmitter-based optical structures 126b. The second transmitter-based optical structures 126b may be integrated with an electromagnetic energy transmitter 102, or the second transmitter-based optical structures 126b may be formed as one or more separate devices. A fiber-based conduit 104d couples the beam-shaping optics 126 of the electromagnetic energy transmitter 102, and a fiber-based conduit 104e couples the second transmitter-based optical structures 126b to the safety sensors module 120 of the second transmitter-based optical structures 126b. In some cases, the fiber-based conduits 104d, 104e are internal conduits, electronic structures, opto-mechanical couplings, or some other suitable structure. The second transmitter-based optical structures 126b are further coupled to the first (primary) fiber-based conduit 104.

In some cases, the second transmitter-based optical structures 126b are arranged as a fiber-based combining structure. The combining structure may simply optically join fiber-based conduit 104d and fiber-based conduit 104e. In this case, since the secondary light signal 118d returned from electromagnetic energy receiver 200 has a low intensity, the light that passes back into the high-flux energy (e.g., laser) optical structures will not cause harm, while the light that passes into the safety sensor module 120 (e.g., photodiode), or the absence of such light, will be used as described in the present disclosure.

In addition, or in the alternative, the light energy that is passed from the electromagnetic energy transmitter 102 to the electromagnetic energy receiver 200 may have components with two or more wavelengths. In such cases, a dichroic, or another optical element having wavelength discerning properties, can pass light with a first wavelength and reflect the light having the second (e.g., sensing) wavelength back toward the electromagnetic energy receiver 200 via the first (primary) fiber-based conduit 104a or the second (secondary) fiber-based conduit 104b.

In some other cases, the combining structure may include a wavelength filter structure such that outbound high-flux radiation does not pass into fiber-based conduit 104e, but a returned safety signal (e.g., secondary light signal 118d) of a different wavelength that is sent from an electromagnetic energy receiver 200 does pass through fiber-based conduit 104e. For example, where an outbound high-flux energy is transmitted having components with two or more wavelengths, if the sensing wavelength is polarized, reflected light returned from the electromagnetic energy receiver 200 will not be polarized, and the component that is orthogonal to the original light will pass through a polarized filter in the second transmitter-based optical structures 126b to the safety sensors module 120.

In some embodiments where a high-flux energy signal is transmitted with two or more components of different wavelength, a reflecting device 232 of the electromagnetic energy receiver 200 is arranged very close to where the first (primary) fiber-based conduit 104a is coupled to the electromagnetic energy receiver 200, a second wavelength may be used to detect issues with the first (primary) fiber-based conduit 104a. For example, whereas reflected light in the high-flux energy wavelength is permitted to continue into the electromagnetic energy receiver 200 toward the energy conversion components 202, some of that light is reflected back toward the second (secondary) fiber-based conduit 104b, thereby also sampling the electromagnetic energy receiver 200 and providing information about the operational quality of the electromagnetic energy receiver 200. Along these lines, it is known that light energy of different wavelengths is scattered and absorbed in optical structures such as a fiber-based conduit at different rates. This differential loss can be used to compare signal strength of the secondary light signal, detect a length of the fiber-based conduit, and diagnose particular problems (e.g., incipient failure) of the fiber-based conduit.

In yet one more use of these structures, if the first (primary) fiber-based conduit 104a has a different numerical aperture (NA) than the second (secondary) fiber-based conduit 104b, then a "tight" bend radius (e.g., one-half inch diameter, one-fourth inch diameter, or some other diameter) in the fiber-based conduit will cause a different returned signal strength (i.e., more loss in the fiber-based conduit with the lower NA).

It has been recognized by the inventors that in some cases, differential propagation of two wavelengths in a high-flux signal may provide a mechanism by which a safety system as described herein may be carried out. It has also been recognized that in some cases, an embodiment may include one first (primary) high-flux fiber-based conduit 104a and two or more second (secondary) fiber-based conduits 104b; and in such cases, various ones of the second (secondary) fiber-based conduits 104 have a different numerical aperture (NA). In these cases, useful information can be discerned with a single wavelength. In still other embodiments, a high-flux signal having multiple wavelengths returned or otherwise passed into multiple parallel second (secondary) fiber-based conduits of differing NA can provide rich information about the fiber-based conduit routing.

For example, the multiple-wavelength, multiple parallel fiber-based conduit embodiment can permit a normalized return signal strength against any bending or spooling of the fiber-based conduit. The normalized return will allow for comparisons having increased accuracy against an expected return signal strength. Hence, the multiple-wavelength, multiple parallel fiber-based conduit embodiment provides a prospective improvement over other systems that may only compare the amount of returned light (e.g., via a second (secondary) fiber-based conduit 104b) against an expected value, wherein the expected value is based on an instantaneous high-flux energy (e.g., laser light) output with a large margin (e.g. +/−50%). Beneficially, by reducing the range of allowable values for return signal strength, the high-flux transmission source can be extinguished, attenuated, or otherwise blocked before leaked high flux energy (e.g. laser light) can cause catastrophic damage to the fiber-based conduit.

Asymmetric properties of light signals may in some cases be used to detect current or impending problems with a fiber-based conduit. For example, in an embodiment of the type described herein, where two or more second (secondary) fiber-based conduits 104b are deployed between an electromagnetic energy transmitter 102 and an electromagnetic energy receiver 200, and where the two second (secondary) fiber-based conduits 104b are coupled to the electromagnetic energy receiver 200 at different points, it would be expected that light signals would have similar timing, phase, and other characteristics. If this is not the case, then the asymmetry may be used to detect damage or other issues with a fiber-based conduit.

The structures of the present disclosure may be used in other ways as well. In one example, a single fiber-based conduit may be operated in a loop-back mode. Here, a fiber-based conduit is formed along the length of the first (primary) fiber-based conduit 104a toward the electromagnetic energy receiver 200 and back to the electromagnetic energy transmitter 102. A signal sent through the conduit can be used as a first-level check, subject to further review, of the integrity (i.e., continuity) of the first (primary) fiber-based conduit 104a. In a second example, the amplitude of the secondary light signal 118d can be tested. A changing amplitude can indicate problems with one or both of the fiber-based conduit and the electromagnetic energy receiver 200. A lower than expected amplitude may indicate a failing or failed conduit; a higher than expected amplitude may indicate damage or some other problem in the electromagnetic energy receiver 200. In a third example, where the electromagnetic energy receiver 200 pulses, modulates, or otherwise controls the secondary light signal 118d, the expected corresponding signal at the safety sensors module 120 can be interpreted as a "heartbeat" or other system integrity signal. In these or yet one more example, optical time domain reflectometry (OTDR) can be applied to detect changes, crack, breaks, or other undesirable issues with a fiber-based conduit.

In many embodiments disclosed herein, any number of PV cell assemblies may be arranged in a suitable energy conversion component 202. In some cases, up to 100 or even more PV cell assemblies are arranged in an energy conversion component 202. Generally, the upper limit of the number of PV cell assemblies may be driven by optical requirements, a maximum size imposed by the application, a maximum size imposed by fabrication methods, or by other reasons. An energy conversion component 202 diameter of a few inches has been considered, and in such embodiment, about 20 to 40 PV cell assemblies of 1 cm width may be selected. Other different sizes are contemplated. Other quantities are also contemplated. In some embodiments constructed for testing, an energy conversion component 202 includes, respectively, one (1) PV cell, four (4) PV cells, and other numbers of PV cells.

In some embodiments described herein, an energy conversion component 202 is formed to be a full circle. In other embodiments, the energy conversion component 202 is formed as a partial circle (i.e., an arc), a sphere, a partial sphere, a hemisphere, a partial hemisphere, a polygon (e.g., a square, a hexagon), an extruded polygon, or in some other shape. In these cases, the electromagnetic energy (e.g., laser light) will be shaped in a different manner by an appropriate electromagnetic shaping structure along the lines of how laser light is shaped by the optical element 230 of FIG. 4.

In the embodiments described herein, one material used in laser power photovoltaic (PV) conversion is gallium arsenide (GaAs), which is also sometimes used as one layer in triple junction solar cells. GaAs is limited to laser wavelengths below about 880 nm. Another material for longer wavelengths is indium gallium arsenide (InGaAs), with varying concentrations of indium depending on the peak wavelength desired. Another material that is sometimes used is gallium antimonide (GaSb). Silicon is also sometimes used for laser power conversion.

In the present disclosure, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with computing systems (e.g., electronics control module 116 and the power control module 204 of FIG. 1), including client and server computing systems, as well as networks have not been shown or described in detail to avoid unnecessarily obscuring descriptions of the embodiments.

The electronics control module 116 and the power control module 204 of FIG. 1 may be arranged as computing devices that include processors, memory, software, and other control mechanisms along these lines.

Processors, as described herein, include central processing units (CPU's), microprocessors, microcontrollers (MCU), digital signal processors (DSP), application specific integrated circuits (ASIC), state machines, and the like.

Accordingly, a processor as described herein includes any device, system, or part thereof that controls at least one operation, and such a device may be implemented in hardware, firmware, or software, or some combination of at least two of the same. The functionality associated with any particular processor may be centralized or distributed, whether locally or remotely. A processors may interchangeably refer to any type of electronic control circuitry configured to execute programmed software instructions. The programmed instructions may be high-level software instructions, compiled software instructions, assembly-language software instructions, object code, binary code, micro-code, or the like. The programmed instructions may reside in internal or external memory or may be hard-coded as a state machine or set of control signals. According to methods and devices referenced herein, one or more embodiments describe software executable by the processor, which when executed, carries out one or more of the method acts.

As known by one skilled in the art, a computing device has one or more memories, and each memory may comprise any combination of volatile and non-volatile computer-readable media for reading and writing. Volatile computer-readable media includes, for example, random access memory (RAM). Non-volatile computer-readable media includes, for example, any one or more of read only memory (ROM), magnetic media such as a hard-disk, an optical disk drive, a flash memory device, a CD-ROM, and the like. In some cases, a particular memory is separated virtually or physically into separate areas, such as a first memory, a second memory, a third memory, etc. In these cases, it is understood that the different divisions of memory may be in different devices or embodied in a single memory.

In the present disclosure, memory may be used in one configuration or another. The memory may be configured to store data. In the alternative or in addition, the memory may be a non-transitory computer readable medium (CRM) wherein the CRM is configured to store instructions executable by a processor. The instructions may be stored individually or as groups of instructions in files. The files may include functions, services, libraries, and the like. The files may include one or more computer programs or may be part of a larger computer program. Alternatively or in addition, each file may include data or other computational support material useful to carry out the computing functions of the systems, methods, and apparatus described in the present disclosure.

In the foregoing description, certain specific details are set forth to provide a thorough understanding of various disclosed embodiments. However, one skilled in the relevant art will recognize that embodiments may be practiced without one or more of these specific details, or with other methods, components, materials, etc. In other instances, well-known structures associated with electronic and computing systems including client and server computing systems, as well as networks have not been shown or described in detail to avoid unnecessarily obscuring descriptions of the embodiments.

Unless the context requires otherwise, throughout the specification and claims which follow, the word "comprise" and variations thereof, such as, "comprises" and "comprising," are to be construed in an open, inclusive sense, e.g., "including, but not limited to."

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content and context clearly dictates otherwise. It should also be noted that the conjunctive terms, "and" and "or" are generally employed in the broadest sense to include "and/or" unless the content and context clearly dictates inclusivity or exclusivity as the case may be. In addition, the composition of "and" and "or" when recited herein as "and/or" is intended to encompass an embodiment that includes all of the associated items or ideas and one or more other alternative embodiments that include fewer than all of the associated items or ideas.

The headings and Abstract of the Disclosure provided herein are for convenience only and do not limit or interpret the scope or meaning of the embodiments.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A power-over-fiber safety system, comprising:
   a processing unit;
   a light-detecting sensor coupled to the processing unit;
   a high-flux electromagnetic energy transmitter;
   an electromagnetic energy receiver arranged to convert received light into electricity;
   a first fiber-based conduit optically coupling the high-flux electromagnetic energy transmitter to the electromagnetic energy receiver, the first fiber-based conduit arranged to pass high-flux light from the high-flux electromagnetic energy transmitter to the electromagnetic energy receiver; and
   a second fiber-based conduit optically coupling the electromagnetic energy receiver to the light-detecting sensor, the second fiber-based conduit arranged to pass at least some light from the electromagnetic energy receiver to the light-detecting sensor, wherein the processing unit is arranged to control an output of the high-flux light from the high-flux electromagnetic energy transmitter based on a control signal from the light-detecting sensor.

2. A power-over-fiber safety system according to claim 1, wherein the processing unit and the light-detecting sensor are integrated into the high-flux electromagnetic energy transmitter.

3. A power-over-fiber safety system according to claim 1, wherein the control signal from the light-detecting sensor is asserted when light passed via the second fiber-based conduit drops below a determined threshold.

4. A power-over-fiber safety system according to claim 1, wherein the electromagnetic energy receiver further comprises:
   an energy conversion component arranged to convert a first portion of the high-flux light to electricity; and
   at least one optical element arranged to direct a second portion of the high-flux light toward the light-detecting sensor via the second fiber-based conduit.

5. A power-over-fiber safety system according to claim 4, wherein the second optical element further comprises:
   a prism.

6. A power-over-fiber safety system according to claim 4, wherein the second optical element further comprises:
   a reflecting device.

7. A power-over-fiber safety system according to claim 1, wherein the first fiber-based conduit and the second fiber-based conduit are separate and distinct, and the first fiber-based conduit and the second fiber-based conduit are substantially bundled by a common containment structure.

8. A power-over-fiber safety system according to claim 1, wherein the first fiber-based conduit and the second fiber-based conduit are a same fiber-based conduit.

9. A power-over-fiber safety system according to claim 1, further comprising:
   an electromechanical shade responsive to the control signal, the electromechanical shade arranged to allow or prevent the high-flux light from passing out of the high-flux electromagnetic energy transmitter.

10. A power-over-fiber safety system according to claim 1, wherein the second optical element further comprises:
    a housing, the housing having a first opto-mechanical coupling arranged to accept the first fiber-based conduit and a second opto-mechanical coupling arranged to accept the second fiber-based conduit.

11. A power-over-fiber safety method, comprising:
    generating, with a high-flux electromagnetic energy transmitter, a high-flux light;
    transmitting the high-flux light toward an electromagnetic energy receiver via a first fiber-based conduit;
    providing a safety sensor, the safety sensor arranged to receive a secondary light signal from the electromagnetic energy receiver via a second fiber-based conduit; and
    generating with the safety sensor, an indication that the transmission of the high-flux light should cease.

12. A power-over-fiber safety method according to claim 11, further comprising:
    based on the indication that the transmission of the high-flux light should cease, controlling an electromechanical shade to prevent the high-flux light from passing out of the high-flux electromagnetic energy transmitter.

13. A power-over-fiber safety method according to claim 11, wherein the high-flux light and the secondary light signal have the same wavelength.

14. A power-over-fiber safety method according to claim 11, wherein the high-flux light and the secondary light signal have a different wavelength.

15. A power-over-fiber safety method according to claim 11, further comprising:
    receiving a control signal to override the safety sensor.

16. A safety-system enabled electromagnetic energy receiver, comprising:
    a housing;
    at least one opto-mechanical coupling arranged in a portion of the housing to receive a first fiber-based conduit;
    an energy conversion component arranged to receive high-flux light and generate electricity from at least a first portion of the received high-flux light; and
    an optical element arranged to direct a second portion of the received high-flux light out from the housing as an indication that the high-flux light was receive; and
    at least one second opto-mechanical coupling arranged in a second portion of the housing to receive a second fiber-based conduit, wherein the first fiber-based conduit is arranged to receive the first portion and the second portion of the high-flux light, and wherein the second fiber-based conduit is arranged to pass the second portion of the received high-flux light out from the housing.

17. A safety-system enabled electromagnetic energy receiver according to claim 16, wherein the second portion of the high-flux light passed through the second fiber-based conduit represents a safety control signal for controlling a high-flux electromagnetic energy transmitter.

18. A safety-system enabled electromagnetic energy receiver according to claim 16, wherein the opto-mechanical coupling and the second opto-mechanical coupling are threaded couplings.

19. A safety-system enabled electromagnetic energy receiver according to claim 16, wherein the high-flux light is a laser light.

20. A safety-system enabled electromagnetic energy receiver according to claim 16, wherein the optical element is arranged to reflect, refract, or focus the second portion of the received high-flux light.

\* \* \* \* \*

UNITED STATES PATENT AND TRADEMARK OFFICE
CERTIFICATE OF CORRECTION

Page 1 of 1

PATENT NO. : 10,580,921 B2
APPLICATION NO. : 16/033120
DATED : March 3, 2020
INVENTOR(S) : Thomas J. Nugent, Jr.

It is certified that error appears in the above-identified patent and that said Letters Patent is hereby corrected as shown below:

In the Claims

Column 26, Line 18:
"indication that the high-flux light was receive; and" should read, --indication that the high-flux light was received; and--.

Signed and Sealed this
Fifteenth Day of June, 2021

Drew Hirshfeld
*Performing the Functions and Duties of the
Under Secretary of Commerce for Intellectual Property and
Director of the United States Patent and Trademark Office*